United States Patent
Fung

(10) Patent No.: US 12,310,067 B2
(45) Date of Patent: May 20, 2025

(54) MULTIGATE DEVICE WITH STRESSOR LAYERS AND METHOD OF FABRICATING THEREOF

(71) Applicant: Taiwan Semiconductor Manufacturing Company, Ltd., Hsinchu (TW)

(72) Inventor: Ka-Hing Fung, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 541 days.

(21) Appl. No.: 17/446,420

(22) Filed: Aug. 30, 2021

(65) Prior Publication Data

US 2023/0068140 A1    Mar. 2, 2023

(51) Int. Cl.
| | | |
|---|---|---|
| H10D 30/69 | (2025.01) | |
| H01L 21/02 | (2006.01) | |
| H10D 30/01 | (2025.01) | |
| H10D 30/67 | (2025.01) | |
| H10D 62/10 | (2025.01) | |
| H10D 84/01 | (2025.01) | |
| H10D 84/03 | (2025.01) | |
| H10D 84/85 | (2025.01) | |

(52) U.S. Cl.
CPC ....... *H10D 30/795* (2025.01); *H01L 21/0259* (2013.01); *H10D 30/031* (2025.01); *H10D 30/6735* (2025.01); *H10D 30/6757* (2025.01); *H10D 62/118* (2025.01); *H10D 84/0167* (2025.01); *H10D 84/0188* (2025.01); *H10D 84/038* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 2004/0104405 A1 | 6/2004 | Huang et al. | |
| 2005/0040460 A1 | 2/2005 | Chidambarrao et al. | |
| 2006/0057787 A1* | 3/2006 | Doris | H01L 29/7843 257/350 |
| 2007/0274654 A1 | 11/2007 | Choudhury et al. | |
| 2009/0114955 A1* | 5/2009 | Stapelmann | H01L 29/66795 438/479 |
| 2013/0075818 A1* | 3/2013 | Lee | H01L 21/845 257/E21.409 |

(Continued)

FOREIGN PATENT DOCUMENTS

JP    2007005621 A   *  1/2007   ......... H01L 29/7843

OTHER PUBLICATIONS

Machine Translation of JP 2007005621 A; Published 2007 (Year: 2007).*

*Primary Examiner* — Suberr L Chi
*Assistant Examiner* — Carnell Hunter, III
(74) *Attorney, Agent, or Firm* — Haynes and Boone, LLP

(57) ABSTRACT

Methods and devices of providing tensile/compressive stressor layers for gate-all-around devices. A first GAA device and a second GAA are disposed having a shallow trench isolation feature and one of more stressor layers between gate structures of the first GAA device and the second GAA. The stressor layers can provide tensile stress to a channel layer of the first GAA device and a compressive stress to another channel layer of the second GAA device.

20 Claims, 26 Drawing Sheets

(56) References Cited

U.S. PATENT DOCUMENTS

| | | | |
|---|---|---|---|
| 2015/0200297 A1* | 7/2015 | Lee | H01L 29/7843 |
| | | | 438/435 |
| 2015/0235940 A1 | 8/2015 | Chen et al. | |
| 2016/0077293 A1 | 3/2016 | Jou et al. | |
| 2016/0087059 A1 | 3/2016 | Hsieh et al. | |
| 2016/0190312 A1 | 6/2016 | Zhang et al. | |
| 2018/0090494 A1* | 3/2018 | Chao | H01L 29/165 |
| 2020/0051979 A1* | 2/2020 | Ando | H01L 21/823885 |
| 2020/0098894 A1* | 3/2020 | Holland | H01L 29/7851 |
| 2020/0126867 A1* | 4/2020 | Zhou | H01L 21/823878 |
| 2021/0083054 A1* | 3/2021 | Liaw | H01L 29/78696 |
| 2021/0202478 A1* | 7/2021 | Guha | H01L 29/78696 |

\* cited by examiner

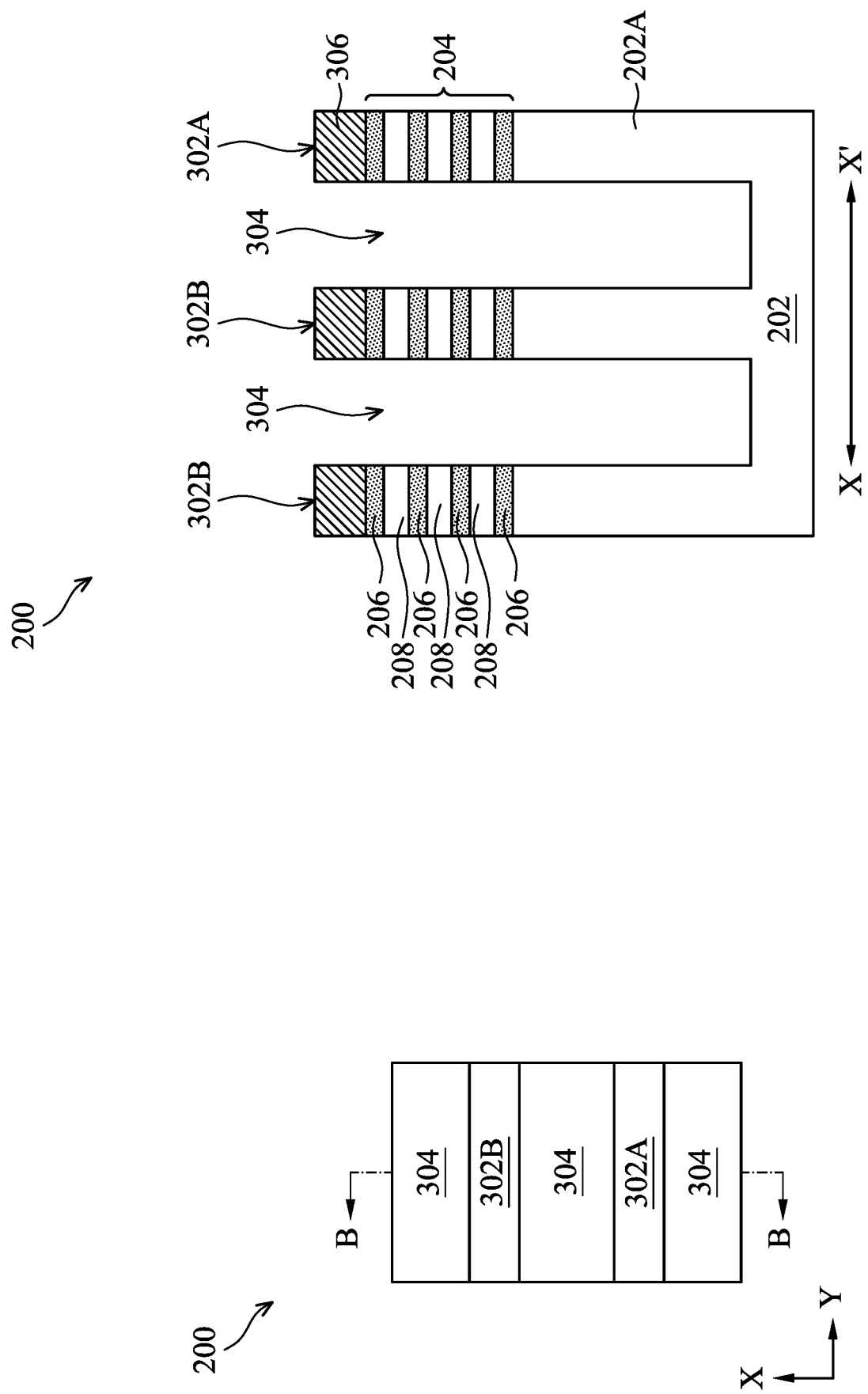

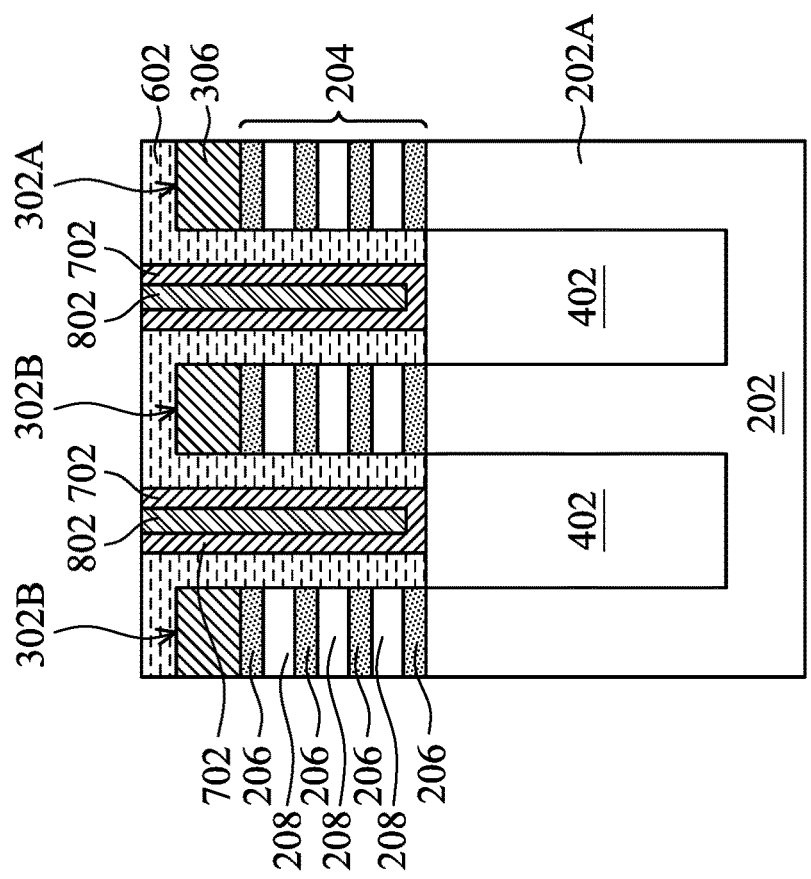
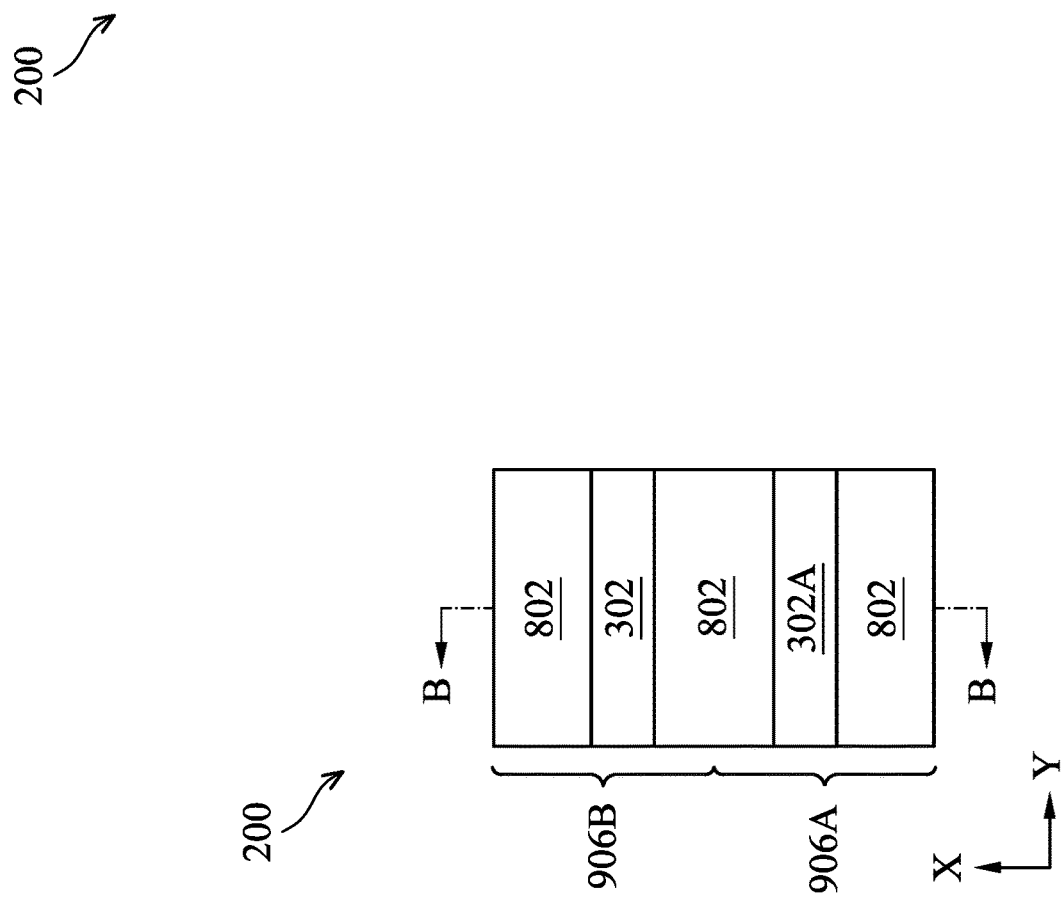
FIG. 8B
FIG. 8A

MULTIGATE DEVICE WITH STRESSOR LAYERS AND METHOD OF FABRICATING THEREOF

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

One way to improve transistor performance is through selective application of stress to portions of the transistor (e.g., channel region). Stress distorts or strains the materials such as the semiconductor crystal lattice, and the distortion in turn affects the band alignment and charge transport properties of the material. However, challenges arise in that NMOS and PMOS devices require different stress in order to enhance carrier mobility. Introduction of these desired stresses is complicated by the increasing complexity of device structures.

For example, recently, multigate devices have been introduced to improve gate control. Multigate devices have been observed to increase gate-channel coupling, reduce OFF-state current, and/or reduce short-channel effects (SCEs). One such multigate device is the gate-all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. However, as GAA devices continue to scale, challenges arise in achieving desired gate density and performance. Accordingly, although existing GAA devices and methods for fabricating such have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 3A, 8A, 9A, 10A, and 13A are fragmentary top views of the multigate device of, in portion or entirety, at various fabrication stages (such as those associated with the method in FIG. 1) according to various aspects of the present disclosure.

FIGS. 2B, 3B, 4A, 5A, 6A, 7A, 8B, 9B, 10B, 11A, 12A, and 13B are fragmentary cross-sectional views of the multigate device of, in portion or entirety, at various fabrication stages (such as those associated with the method in FIG. 1) according to various aspects of the present disclosure.

DETAILED DESCRIPTION

Figure 1:
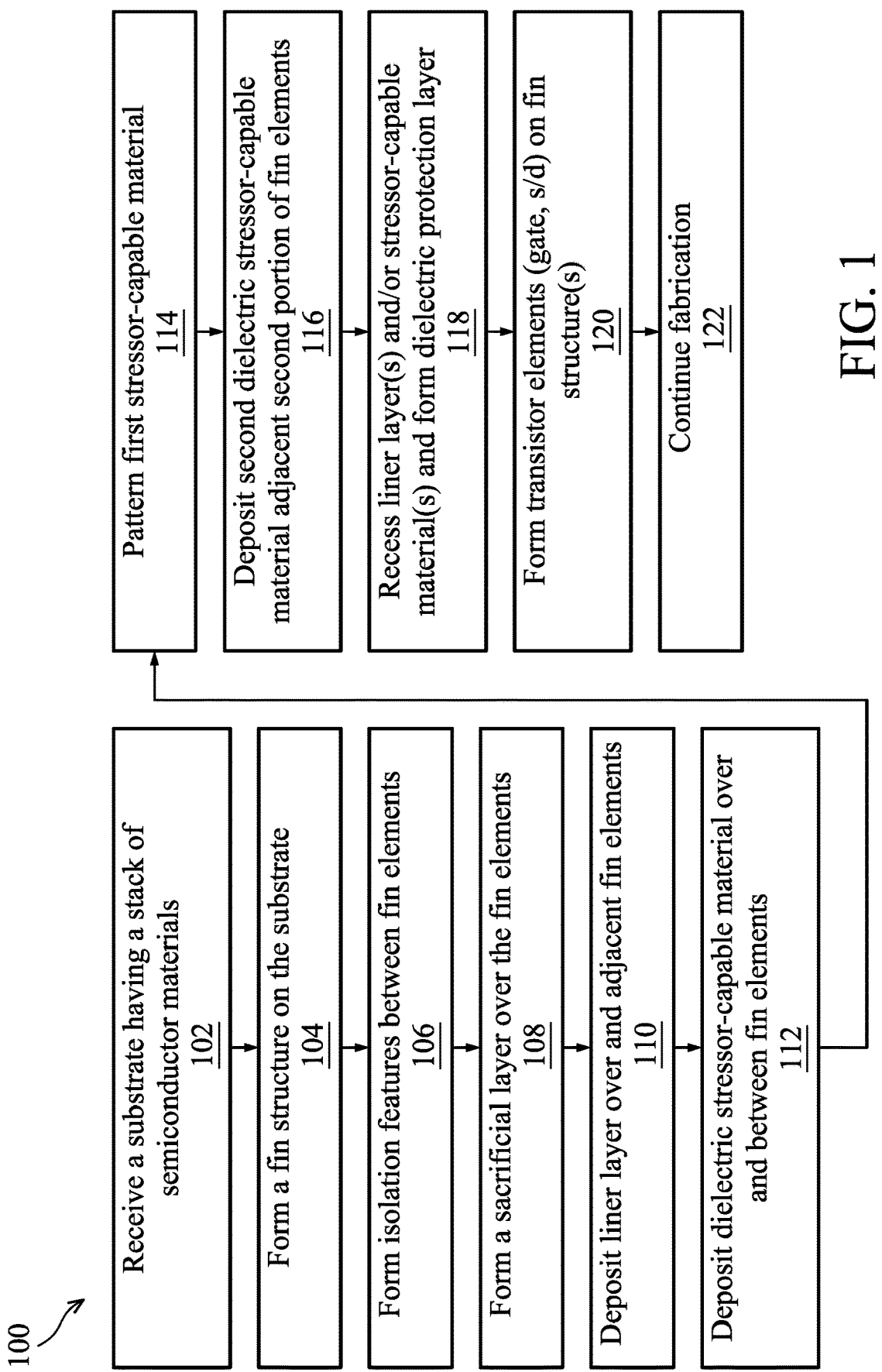
FIG. 1 is a flow chart of a method for fabricating a multigate device according to various aspects of the present disclosure.
Figure 2B:
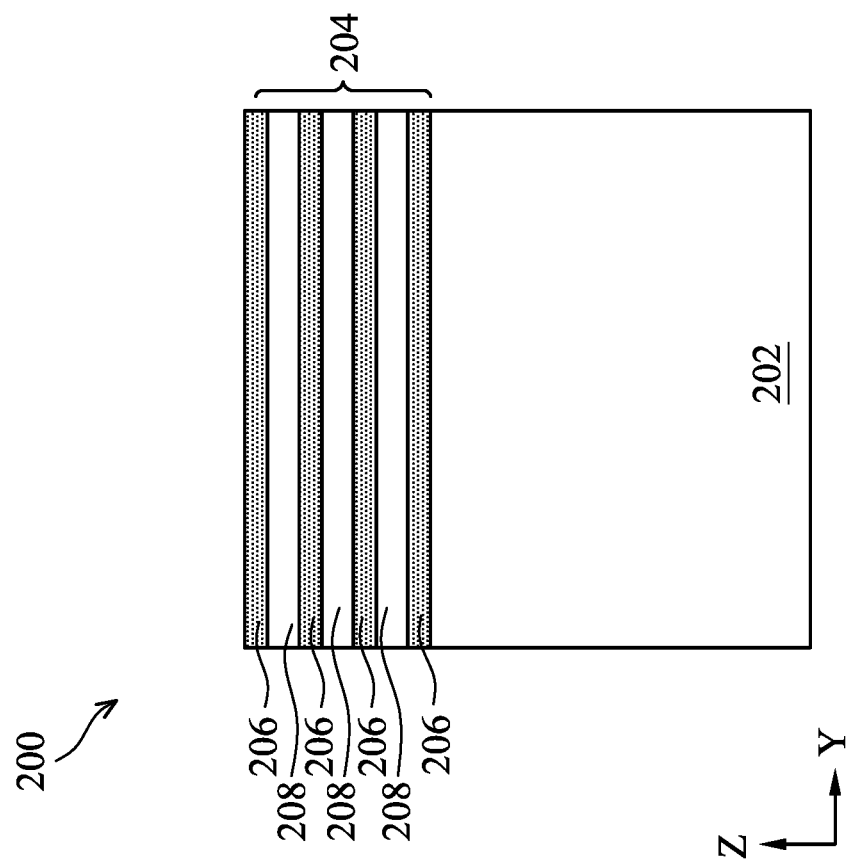
Figure 2A:
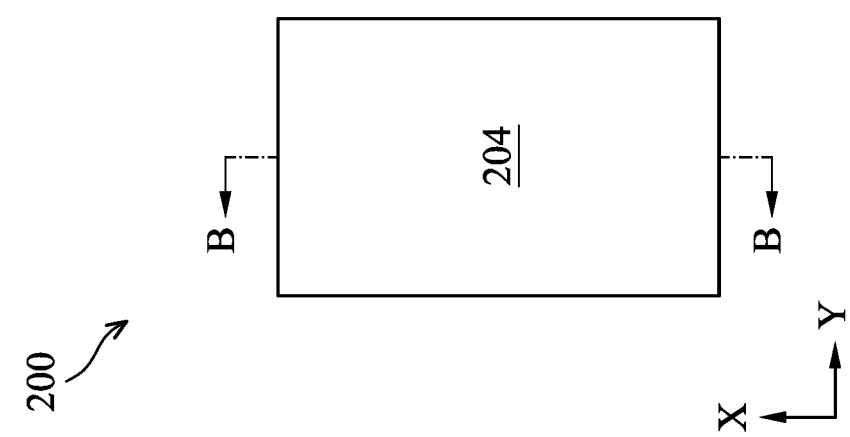

The present disclosure relates generally to integrated circuit devices, and more particularly, to techniques for fabricating and resulting multigate devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," "front," "back" etc. as well as derivatives thereof (e.g., "horizontally," "downwardly," "upwardly," etc.) are used for ease of the present disclosure of one features relationship to another feature. The spatially relative terms are intended to cover different orientations of the device including the features. Furthermore, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

By controlling both the magnitude and distribution of stress in a finished device, devices can experience an increase in carrier mobility and thus, overall device performance. Introduction of these stress can be different between NMOS and PMOS devices as each benefits from a different stress profile. For example, a tensile stress in a region of the NMOS device can increase the performance (e.g., tensile stress in the channel region can enhance carrier mobility) if applied along the channel direction and/or a direction transverse to the channel (e.g., along the channel length and the channel width). However, an adjacent PMOS device may not experience an improvement from the same stress. Rather, a PMOS device benefits from an oppositely configured compressive stress along the channel direction. In addition to independently controlling the PMOS and/or NMOS devices of a semiconductor device, in some implementations, it is important to control the stress and strain in multiple directions in addition to that provided in the direction and in plane with the channel region. For example, stain perpendicular to the channel (i.e., vertically oriented with respect to a top of the substrate) can also be tuned to effectively manage device performance. As another example, strain from a lateral direction (out of the plane of the top surface of the substrate can also be tuned to effectively manage device performance. Further improvements discussed in one or more embodiments herein provide for introduction of any or all of these stresses or strains in a multi-gate device can further improve the device performance for each of NMOS and PMOS devices.

The present disclosure provides for devices and methods that allow for independently addressing the stress profile desires for PMOS or NMOS device performance enhancement.

Thus, the present disclosure thus proposes methods and devices that provide for a stressor layer that is formed during the multigate device fabrication process and patterned to provide separate stressor profiles for NMOS and PMOS devices. Therefore, a GAA device (for example, a first PMOS GAA device) differs in stress from a second GAA device (for example, a second NMOS GAA device). Details of the proposed methods and stressor layer techniques for fabrication GAA devices and resulting GAA devices are described herein. It is noted that while a multigate device including GAA transistors is used for the following explanation, it can be appreciated that other device types such as fin-type field effect transistors (FinFETs), omega-gate transistors, and/or other suitable transistor types may also be provided by the present methods and devices.

FIG. 1 is a flow chart of an embodiment of a method 100 for fabricating a multigate device according to various aspects of the present disclosure. In some embodiments, method 100 fabricates a device including a plurality of gate-all-around (GAA) transistors. Method 100 is exemplary only and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. The method 100 is exemplified by a device 200, illustrated in FIGS. 2A-13B. Besides what are explicitly shown in figures of the present disclosure, the semiconductor device 200 may include additional transistors, bipolar junction transistors, resistors, capacitors, diodes, fuses, etc.

Multigate device 200 or portion thereof can be included in a microprocessor, a memory, and/or other IC device. In some embodiments, multigate device 200 is a portion of an IC chip, a system on chip (SoC), or portion thereof. The exemplary figures of the multigate 200 have been simplified for the sake of clarity to better understand the inventive concepts of the present disclosure. Additional features can be added in multigate device 200, and some of the features described below can be replaced, modified, or eliminated in other embodiments of multigate device 200. Multigate devices 200, 200' (FIGS. 14A, 14B), 200" (FIGS. 15A, 15B) and so forth share similar features with differences discussed herein and is some implementations may be formed on a same substrate.

The method 100 begins at block 102 where a substrate is received having a stack of semiconductor materials formed thereover. Referring to the example of FIGS. 2A and 2B, a multigate device 200 includes a substrate (wafer) 202. In the depicted embodiment, substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions depending on design requirements of multigate device 200

A semiconductor layer stack 204 is formed over substrate 202, where semiconductor layer stack 204 includes semiconductor layers 206 and semiconductor layers 208 stacked vertically (e.g., along the z-direction) in an interleaving or alternating configuration from a surface of substrate 202. In some embodiments, semiconductor layers 206 and semiconductor layers 208 are epitaxially grown in the depicted interleaving and alternating configuration. For example, a first one of semiconductor layers 206 is epitaxially grown on substrate, a first one of semiconductor layers 208 is epitaxially grown on the first one of semiconductor layers 206, a second one of semiconductor layers 208 is epitaxially grown on the first one of semiconductor layers 206, and so on until semiconductor layers stack 204 has a desired number of semiconductor layers 206 and semiconductor layers 208. In such embodiments, semiconductor layers 206 and semiconductor layers 208 can be referred to as epitaxial layers. In some embodiments, epitaxial growth of semiconductor layers of the stack 204 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 206 is different than a composition of semiconductor layers 208 to achieve etching selectivity during subsequent processing. In some embodiments, semiconductor layers 206 have a first etch rate to an etchant and semiconductor layers 208 have a second etch rate to the etchant, where the second etch rate is less than the first etch rate. In the depicted embodiment, semiconductor layers 206 and semiconductor layers 208 include different materials, constituent atomic percentages, constituent weight percentages, thicknesses, and/or characteristics to achieve desired etching selectivity during an etching process, such as an etching process implemented to form suspended channel layers in channel regions of multigate device 200. For example, in some implementations where semiconductor layers 206 include silicon germanium and semiconductor layers 208 include silicon, a silicon etch rate of semiconductor layers 208 is less than a silicon germanium etch rate of semiconductor layers 206. In some embodiments, semiconductor layers 206 and semiconductor layers 208 can include the same material but with different constituent atomic percentages to achieve the etching selectivity.

As described further below, semiconductor layers 208 or portions thereof form channel regions of multigate device 200. Semiconductor layers 206 are sacrificial layers. In the depicted embodiment, semiconductor layer stack 204 includes three semiconductor layers 208 and four semiconductor layers 206, however this is exemplary only and any number of layers, or layer pairs, may be provided. After undergoing subsequent processing, such configuration will result in multigate device 200 having three channels. However, the present disclosure contemplates embodiments where semiconductor layer stack 204 includes more or less semiconductor layers, for example, depending on a number of channels desired for multigate device 200 (e.g., a GAA transistor) and/or design requirements of multigate device 200.

Figure 3C:
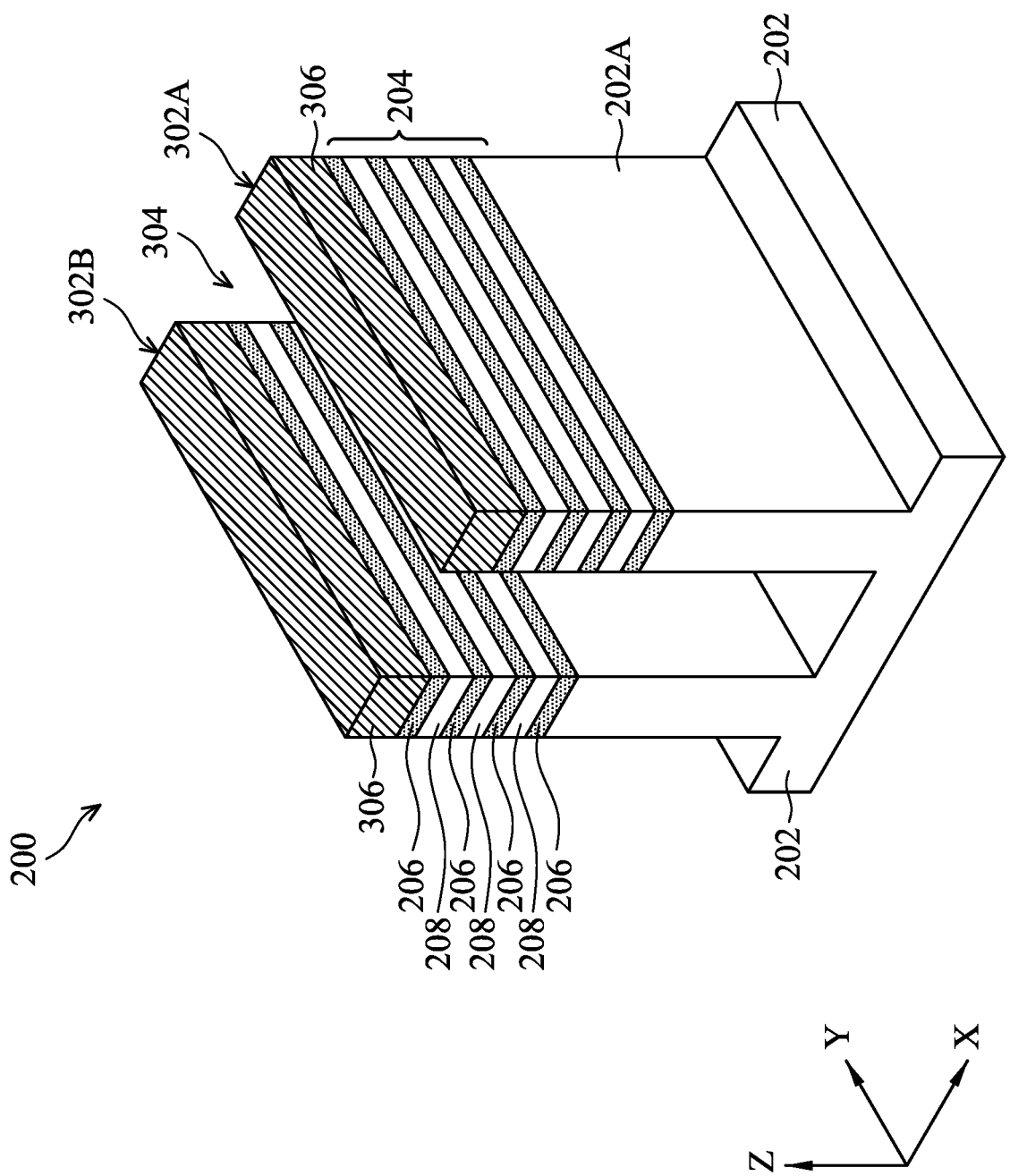
FIGS. 3C, 4B, 5B, 6B, 7B, 8C, 9C, 10C, 11B, 12B, and 13C are fragmentary perspective views of a multigate device, in portion or entirety, at various fabrication stages (such as those associated with the method in FIG. 1) according to various aspects of the present disclosure.

The method 100 then proceeds to block 104 of the method 100 where a fin structure is formed on the substrate. The fin structure includes the stack of semiconductor materials and in some implementations, a portion of the underlying substrate. Referring to FIGS. 3A, 3B, and 3C, semiconductor layer stack 204 is patterned to form fins 302 (also referred to as fin structures, fin elements, etc.). Fins 302 include a substrate portion (i.e., a portion of substrate 202 denoted 202A) and a semiconductor layer stack portion (i.e., a remaining portion of semiconductor layer stack 204 including semiconductor layers 206 and semiconductor layers 208). Fins 302 extend substantially parallel to one another along a y-direction, having a length defined in the y-direction, a width defined in an x-direction, and a height defined in a z-direction. In some implementations, a lithography and/or etching process is performed to pattern semiconductor layer stack 204 to form fins 302. The lithography process can include forming a resist layer over semiconductor layer stack 204 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process removes portions of semiconductor layer stack 204 while using the patterned resist layer as an etch mask. In some embodiments, the patterned resist layer is formed over a hard mask layer 306 disposed over semiconductor layer stack 204, a first etching process removes portions of the hard mask layer to form a patterned hard mask layer, and a second etching process removes portions of semiconductor layer stack 204 using the patterned hard mask layer 306 as an etch mask. The etching process can include a dry etching process, a wet etching process, other suitable etching process, or combinations thereof. In some embodiments, the etching process is a reactive ion etching (RIE) process. After the etching process, the patterned resist layer (and, in some embodiments, a hard mask layer) is removed, for example, by a resist stripping process or other suitable process. Alternatively, fins 302 are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some embodiments, directed self-assembly (DSA) techniques are implemented while patterning semiconductor layer stack 204. Further, in some embodiments, the exposure process can implement maskless lithography, electron-beam (e-beam) writing, and/or ion-beam writing for patterning the resist layer.

Such processes can also provide fin structures 302 including hard mask layer 306 thereover and comprising semiconductor layer stack 204, and fin portion 202A, as depicted in FIGS. 3B and 3C. The hard mask layer 306 may be a multi-layer structure including for example a nitride layer and an overlying oxide layer. Between the fins 302 are trenches 304 provided by the removal of the portions of the stack 204 and the substrate 202. Each of the fin structures 302 defines an active region on the substrate. In an embodiment, a first fin 302A is designed for forming a first type of field effect transistor (FET), while a second fin 302B is designed for forming a second type of FET. In some implementations, the first fin 302A is designated for an NFET and the second fin 302B is designated for a PFET.

The method 100 then proceeds to block 104 where isolation features such as shallow trench isolation (STI) features are formed between the fin structures. Referring to the example of FIGS. 4A, 4B, 5A and 5B, shallow trench isolation features 402 are disposed in the trench 304. In an embodiment, the isolation material is multi-layer for example, including a liner layer and an overlying layer such as an oxide material. In some embodiments, oxide material is deposited by a flowable CVD (FCVD) process that includes, for example, depositing a flowable oxide material (for example, in a liquid state) over multigate device 200 and converting the flowable oxide material into a solid oxide material by an annealing process. The flowable oxide material can flow into trenches 304 and conform to exposed surfaces of multigate device 200, enabling in some implementations void-free filling of trenches 304.

Figure 4A:
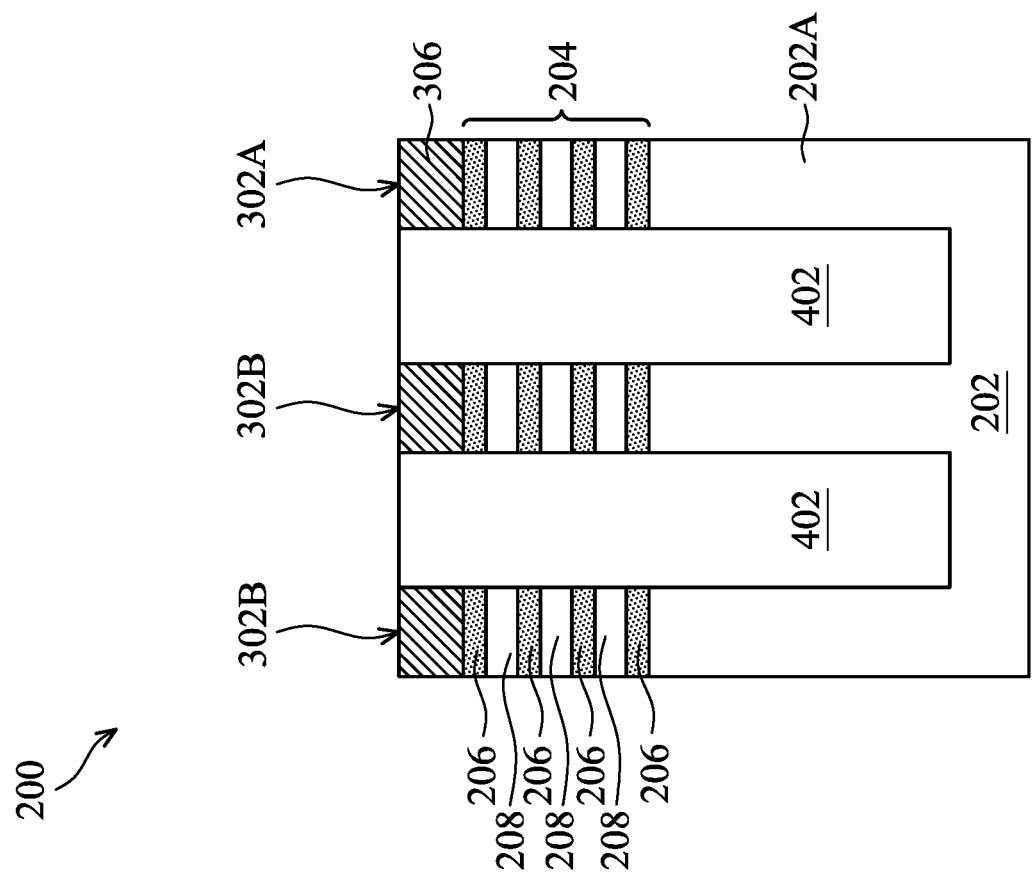
Figure 4B:
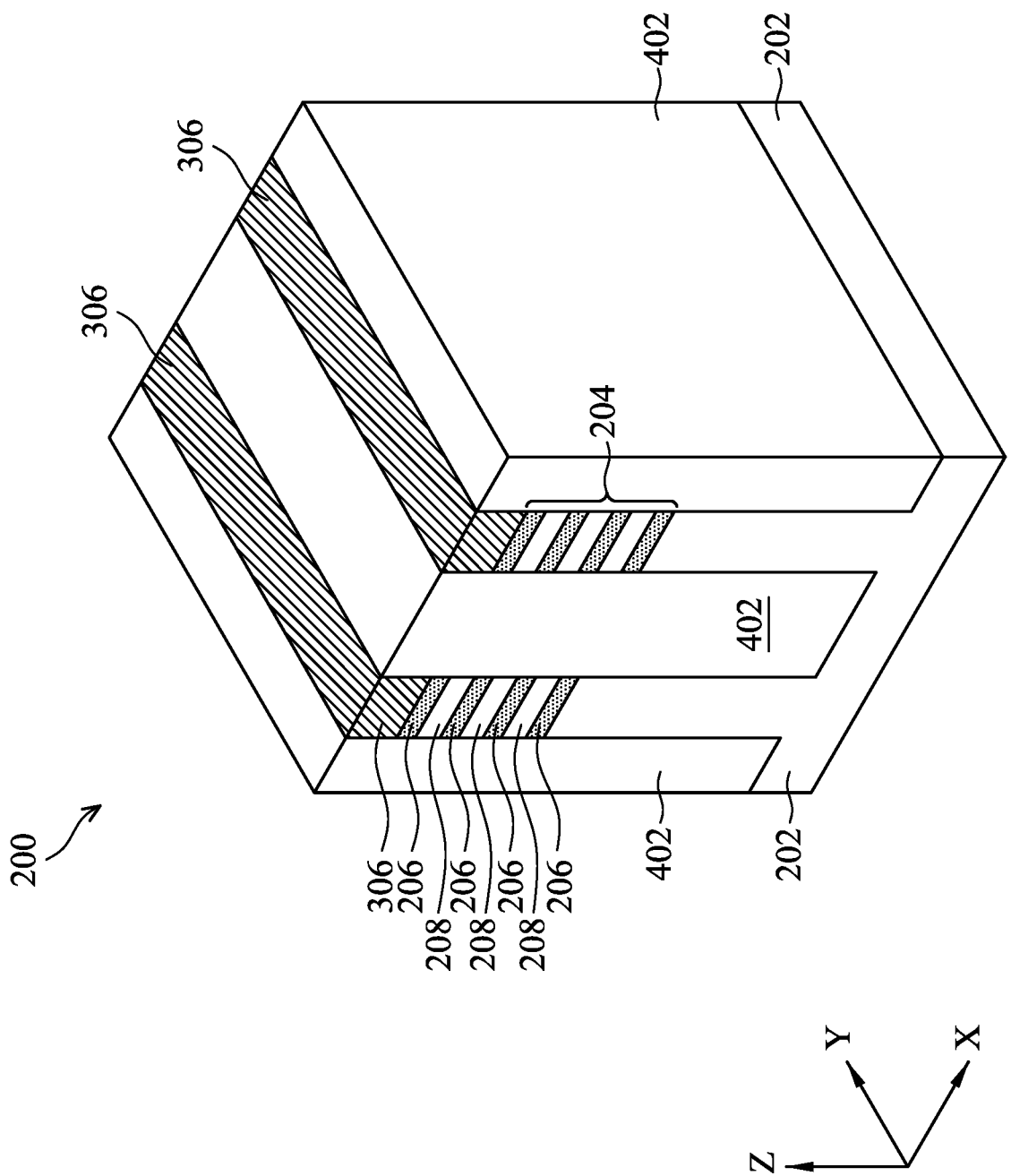
Figure 5A:
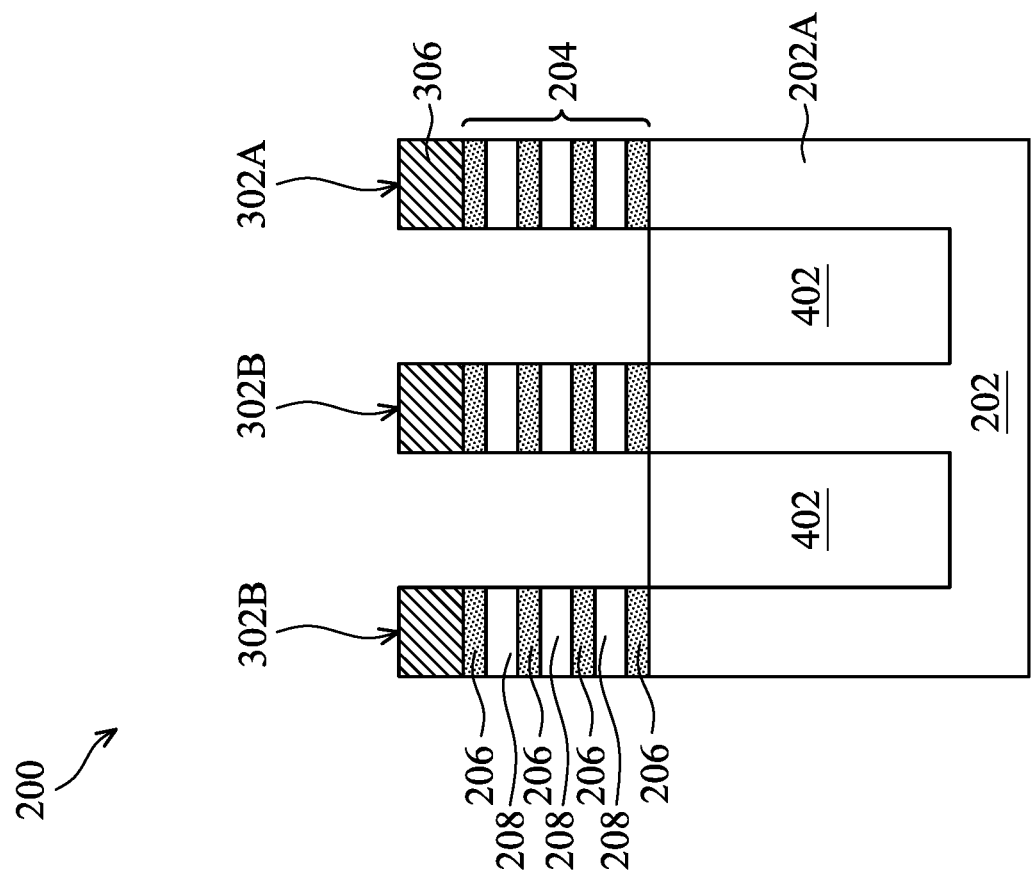
Figure 5B:
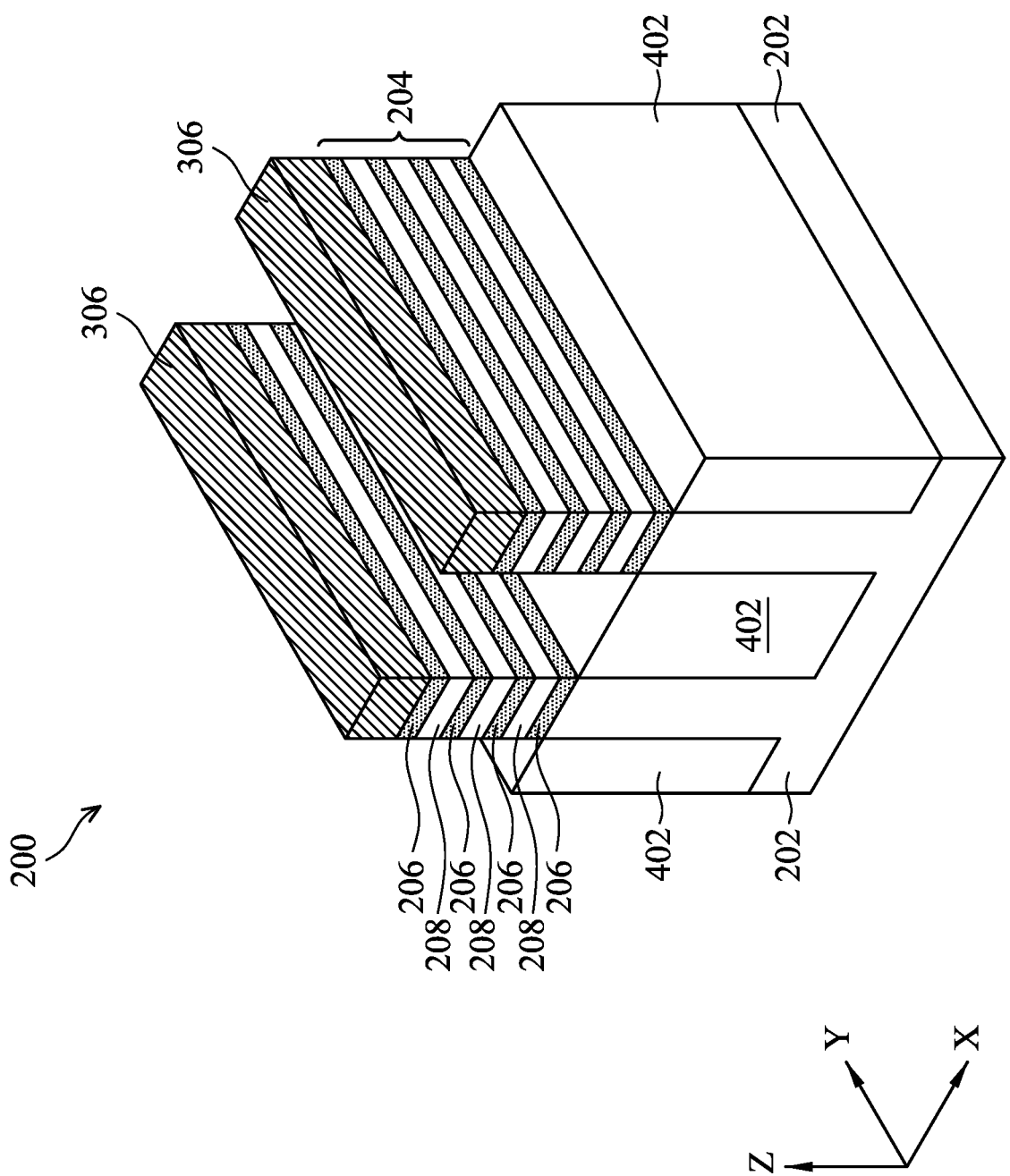
Figure 6A:
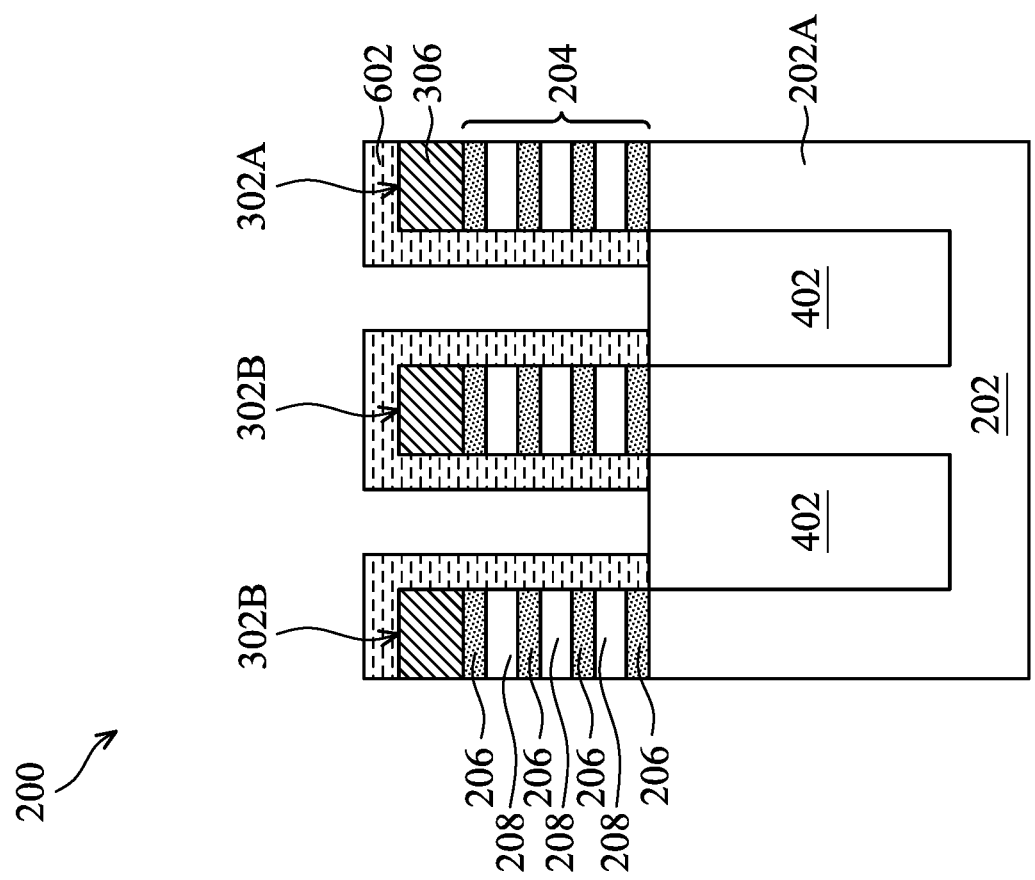
Figure 6B:
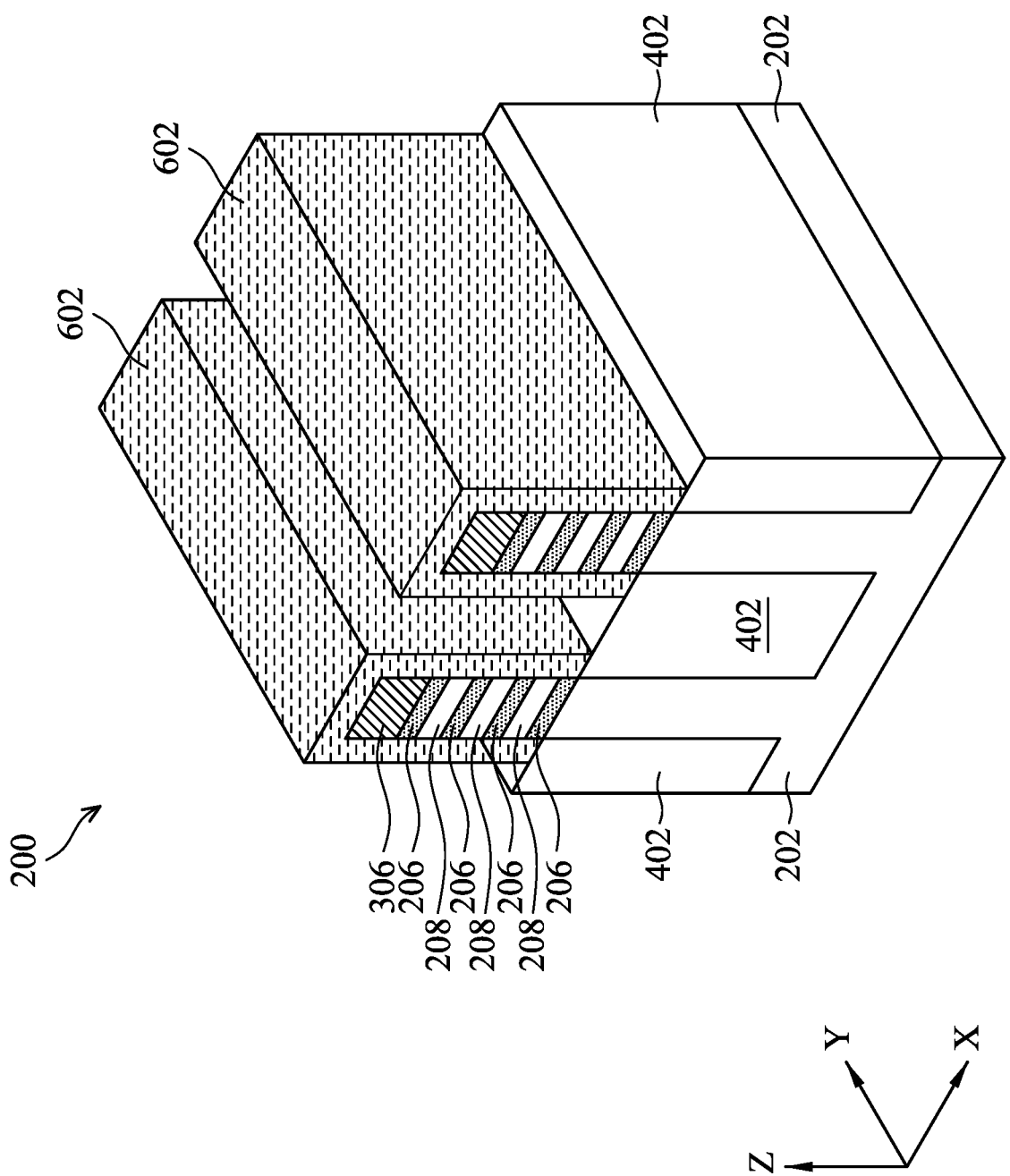

In some embodiments, the insulating material forming isolation layer 402 may include SiO2, silicon nitride, silicon oxynitride, fluorine-doped silicate glass (FSG), a low-k dielectric, combinations thereof, and/or other suitable materials known in the art. In various examples, the dielectric material may be deposited by a CVD process, a subatmospheric CVD (SACVD) process, a flowable CVD process, an ALD process, a PVD process, or other suitable process. The deposition process can overfill trenches 304 (not shown) such that a thickness of the material for the isolation features 402 is greater than a height of fins 302. After the deposition process, the planarization process, such as a chemical mechanical polishing (CMP) process, is performed on the materials, thereby reducing the thickness. This planarization forms a surface such as illustrated in FIGS. 4A and 4B. In an embodiment, the planarization process is performed using an etch stop of the hard mask layer 306.

The formation of the isolation features in block 106 may then continue to recess the deposited (and planarized) insulating material(s) to form the STI structures such that the fin structures extend above the STI structures. Referring to the example of FIGS. 5A and 5B, the insulating material(s) may then be recessed such that fin structures 302 extend (protrude) from between etched-back isolation features 402. The etching process to recess the isolation material is configured to selectively remove material (e.g., oxide) with respect to the fin structure 302. Thus, the isolation features 402 fill lower portions of the trenches 304 between the fin structure 302. In some embodiments, a field oxide, a LOCOS feature, and/or other suitable isolation features may additionally or alternatively be implemented on and/or within the substrate. In an embodiment, the isolation features 402 have a top surface that is below a bottom surface of the lowest layer 206, which may be a sacrificial layer when releasing the channel layers 208. In other words, the isolation features 402 lie below the channel region of the device 200.

The method 100 then proceeds to block 108 where a sacrificial layer is formed over the fin structure. Referring to the example of FIGS. 6A and 6B, a sacrificial layer 602 is formed on each fin element 302. In some embodiments, the sacrificial layer 602 may have a composition similar to that of the semiconductor layers 206, which are also sacrificial layers. For example, in an embodiment, the sacrificial layer 602 is formed of silicon germanium (SiGe) and the semiconductor layers 206 are formed of SiGe. In some implementations, the sacrificial layer 602 and the semiconductor layers 206 include a composition that allows selective removal of the semiconductor layers 206 and the sacrificial layer 602 during the release of channel layers 208 in a subsequent process by a single etching process, discussed below. In other embodiments, the sacrificial layer 602 may include a different composition than that of the epitaxial layers 206. Thus, in some implementations, the sacrificial layer 602 is removed in a separate and distinct etching step from the step removing the semiconductor layers 206.

In an embodiment, the sacrificial layer 602 may be epitaxially grown using vapor phase epitaxy (VPE), molecular bean epitaxy (MBE) or formed by a deposition process such as CVD process, a subatmospheric CVD (SACVD) process, a flowable CVD process, an ALD process, a PVD process, or other suitable process. After deposition, in some embodiments, and depending on the deposition process utilized, operations at block 108 may include, after conformal deposition of the material for sacrificial layer 602, an etch back processes to remove material of the sacrificial layer 602 from on portions of the isolation feature 402 between fins 302.

The method 100 then proceeds to block 110 where a liner layer is formed over the fin elements. In some embodiments of the method 100 however, the liner layer of block 110 is omitted. Block 110 may be omitted where an overlying layer or layers are not subject to undesired impact of the fin 302. For example, if an overlying layer is an oxide, it may be beneficial to include the liner layer of block 110 to avoid inadvertent oxidation of the fin 302 and the channel layers 208 in particular. If overlying layers (e.g., stressor layers) are of a composition that will not affect the fin 302 (e.g., a nitride), then in some implementations the liner layer may be omitted. In other implementations, the liner layer may be included to provide an etch stop layer when patterning the overlying layer (e.g., first dielectric stressor layer discussed below).

Exemplary liner layers include silicon nitride, silicon oxynitride, silicon carbonitride (SiCN), and/or other suitable dielectric materials. The liner layer may be formed by CVD process, a subatmospheric CVD (SACVD) process, a flowable CVD process, an ALD process, a PVD process, or other suitable process. In an embodiment, the material of the liner layer is different than that of a subsequently formed stressor layer such that the liner layer can act as an etch stop layer during the patterning of the stressor layer. For example, if an overlying stressor layer is an oxide composition, the liner layer of nitride may provide an etch stop during the selective etching of the oxide composition. The liner layer may have a thickness between approximately 2 and 10 nm nanometers. The thickness may be selected such that appropriate protection of the underlying layers (e.g., to avoid oxidation for overlying materials), sufficient thickness to provide for an etching stop, and/or tuned in thickness to provide appropriate stress as discussed below, while being thin enough to allow adequate gap filling of the subsequently formed materials.

Figure 7A:
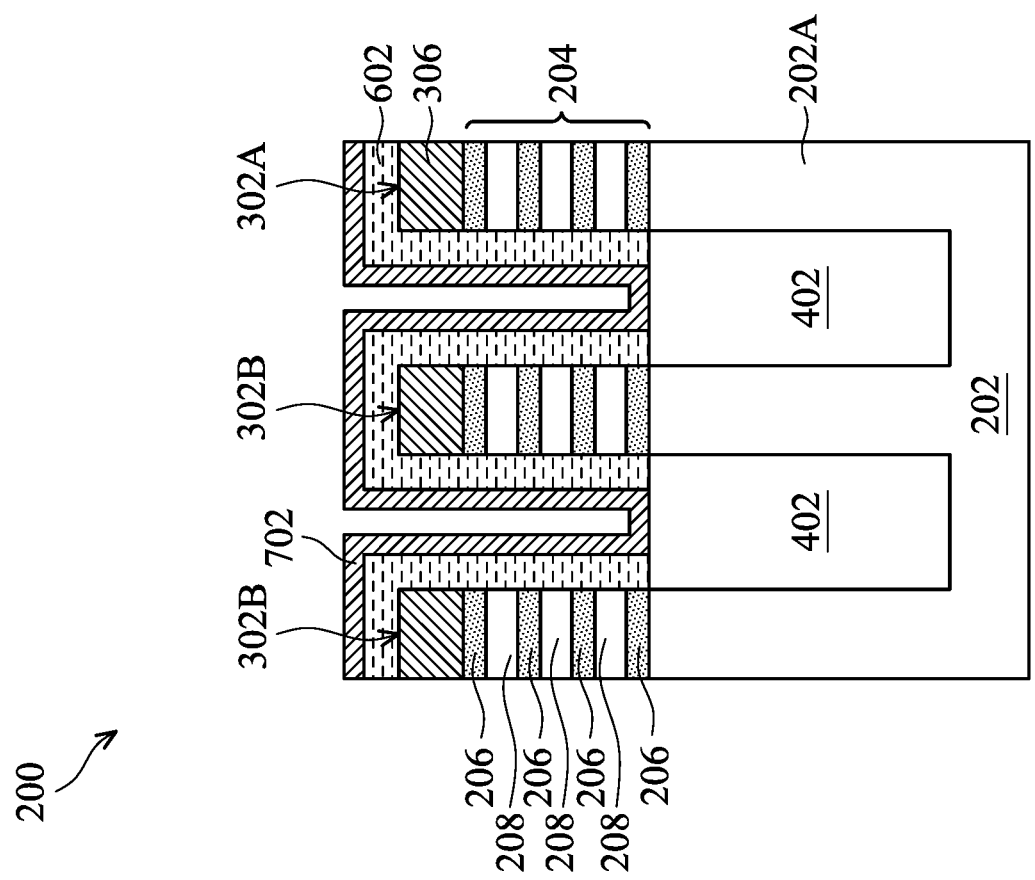
Figure 7B:
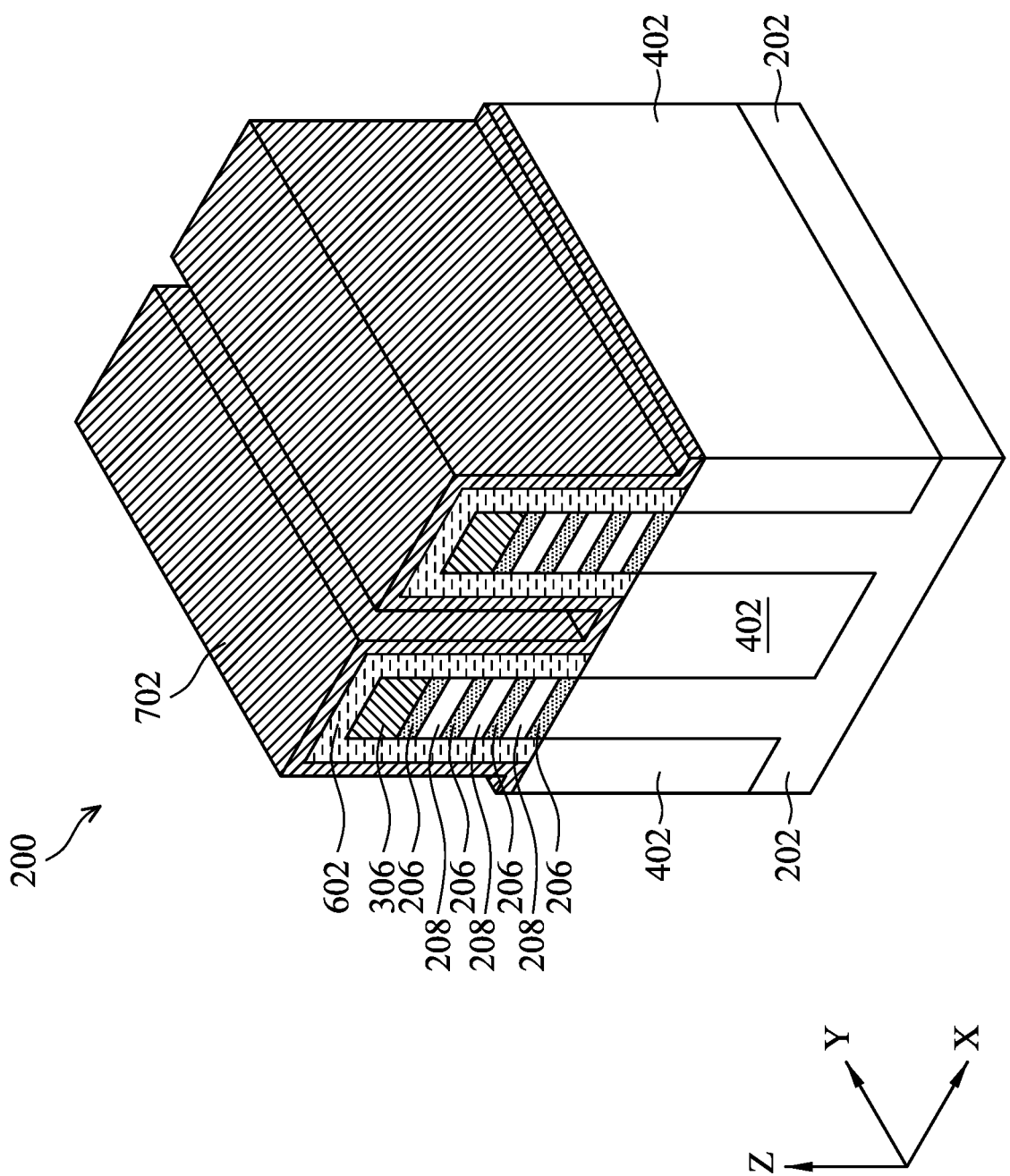

Referring to the example of FIGS. 7A and 7B, a liner layer 702 is disposed over the fin structures 302 and lining the trenches 304. In some embodiments, the liner layer 702 is a thickness such that it provides little to no stress onto the devices formed on the adjacent fins 212. In some embodiments, the liner layer 702 is silicon nitride and is tuned to provide tensile or compressive stress on the adjacent fins 212. The tuning of the silicon nitride composition may be substantially similar to as discussed below with reference to the stressor layer(s).

The method 100 then proceeds to block 112 where a first dielectric stressor-capable material is deposited over and between the fin elements. In an embodiment, the first dielectric stressor-capable material is selected to provide a stress desired for a first type of device. For example, in an embodiment, the first dielectric stressor-capable material is selected to provide a stress desired for an NFET device. Thus, in some implementations, the first dielectric stressor-capable material is selected or tuned to provide a tensile stress in the channel width direction (x-direction) and a compressive stress in the vertical direction (z-direction).

In an embodiment, the first dielectric stressor-capable material is a material that can shrink during subsequent thermal processes. The shrinking of the first dielectric stressor-capable material can cause a tensile stress to the width direction (x-direction) and a compressive stress to the vertical direction (y-direction) of the adjacent structure (e.g., channel region). In an embodiment, the first dielectric stressor-capable material is an oxide composition. Exemplary compositions include an oxide such as tetraethylorthosilicate (TEOS), doped silicon oxide (e.g., carbon doped silicon oxide), and/or other suitable compositions. In some implementations, during subsequent thermal processing the oxide composition will increase in density providing a stress onto the surrounding layer(s), such as the channel region. For example, an oxide may undergo densification from an anneal or further thermal processing of the device 200 (e.g., thereby shrinking), so it can impose a stress on the adjacent material (e.g., a tensile stress in the channel width direction and a compressive stress in the vertical direction). A determination of the tensile or compressive stress (along the channel length) is decided by a relative strength of stress along channel width.

In an embodiment, the first dielectric stressor-capable material a nitride composition tuned to provide a stress for the first device type (e.g., NMOS). The silicon nitride may be tuned to provide a tensile stress onto the channel width direction and/or a compressive stress in the vertical direction. The SiN layer may be tuned by selecting the deposition method, deposition parameters (see below), and/or silicon to nitrogen ratios. The stress of the first dielectric stressor-capable material is described below with reference to FIGS. 14A, 14B, 15A, and 15B.

In some embodiments, the first dielectric stressor-capable material may be deposited by a CVD process, a subatmospheric CVD (SACVD) process, a flowable CVD process, an ALD process, a PVD process, HARP, and/or other process providing suitable gap-filling properties. The deposition may be tuned to provide the desired stress including the process temperature, precursor gas flow rate and ratio, process pressure, and/or other parameters.

Referring to the example of FIG. 8, a first stressor-capable material 802 is deposited over the fins 302 and within the trenches 304. In an embodiment, the first stressor-capable material 802 has a composition selected to provide appropriate stress profile for an NMOS device that will be formed using an active region of the fin 302A. In other words, the channel layers 208 of the fin 302A provide a channel of an NMOS device, the channel being stressed by the first stressor-capable material 802. In an embodiment, the first stressor-capable material 802 may provide a tensile stress in the x-direction and/or y-direction, and a compressive stress in the z-direction on the subsequently released channel regions (208) as discussed below with reference to FIGS. 14A, 14B, 15A, and 15B.

Figure 8C:
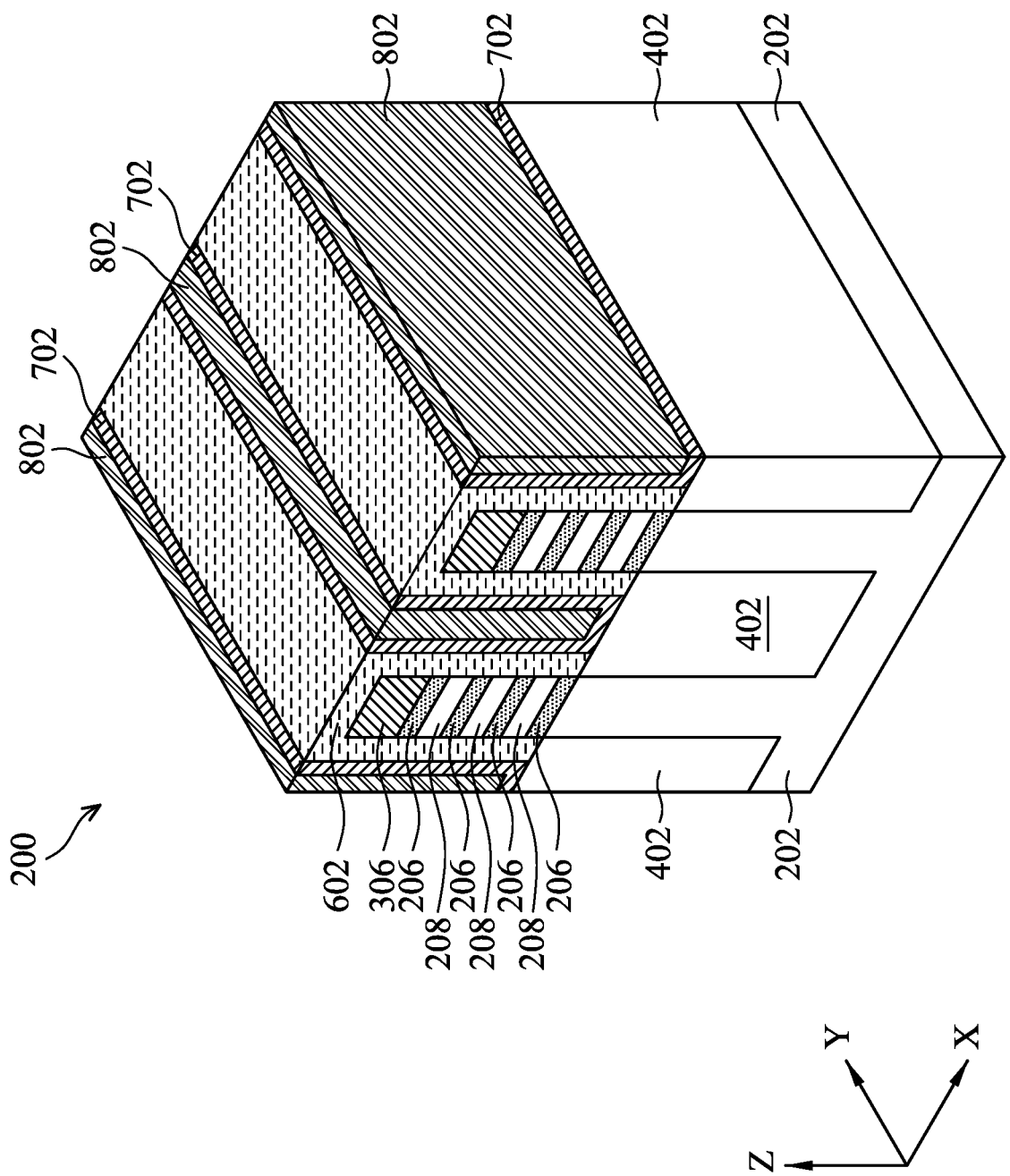

Continuing with the formation of the first stressor-capable material layer, as illustrated in FIGS. 8A, 8B, and 8C, a planarization process may be performed. In some implementations, the sacrificial layer 602 acts as an etch stop for the planarization process. It is noted that the top view of FIG. 8A illustrates the configuration of the fins 302 and the first stressor-capable material 802, however liner layer 702 is omitted for ease of visualization.

In some implementations, the stress profile of the first stressor-capable material 802 changes during the subsequent fabrication processes such as, thermal processes. In an embodiment, an anneal is performed after deposition of the first dielectric stressor-capable layer 802 to provide the suitable quality and stressor capabilities (e.g., densification) of the stressor-capable dielectric layer.

In some implementations, the method 100 then proceeds to block 114 where the first dielectric stressor-capable material is patterned. The patterning may include removing the first dielectric stressor-capable material from a second region of the device, while maintaining the first dielectric stressor-capable material in a first region of the device. The first region of the device being targeted to a first device type (e.g., NMOS) and the second region of the device being targeted to a second device type (e.g., PMOS).

To perform the patterning, a masking element may be formed over the first region of the device during an etching process that provides for the removal of the first stressor layer from the second region of the device. In an embodiment, the first region of the device includes active regions designed for a first transistor type, and the second region of the device includes active regions designed for a second transistor type. The first transistor type is the transistor type targeted for improvement by the first stressor-capable material. In some implementations, the first transistor type is an NMOS transistor and the second transistor type is a PMOS transistor. For example, in some implementations, the first dielectric stressor-capable material is directed to provided advantageous stress onto the channel regions of NMOS devices, and as such, the masking element is formed over the NMOS device region including the first dielectric stressor-capable material adjacent the fins providing the NMOS device active regions. Meanwhile, the masking element exposes regions of the substrate and fin elements that are designed to form PMOS devices.

Figure 9B:
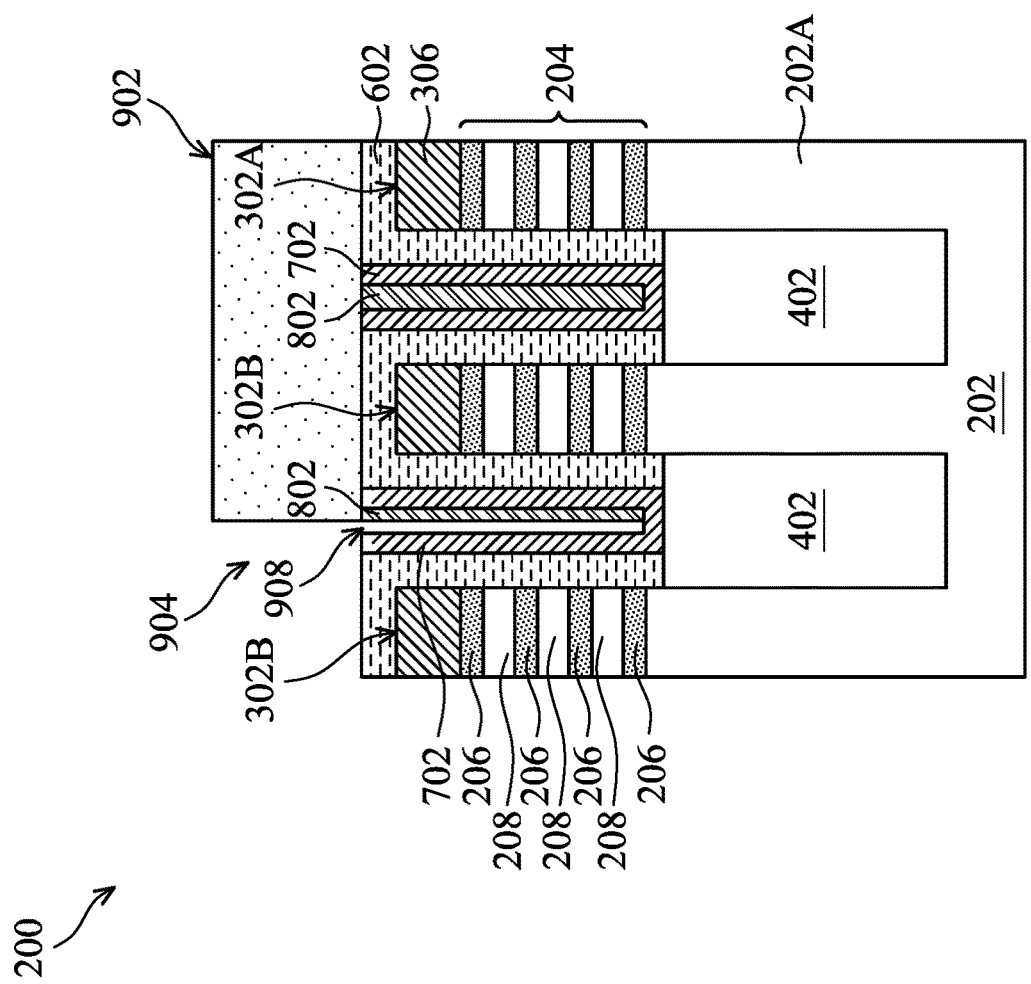
Figure 9A:
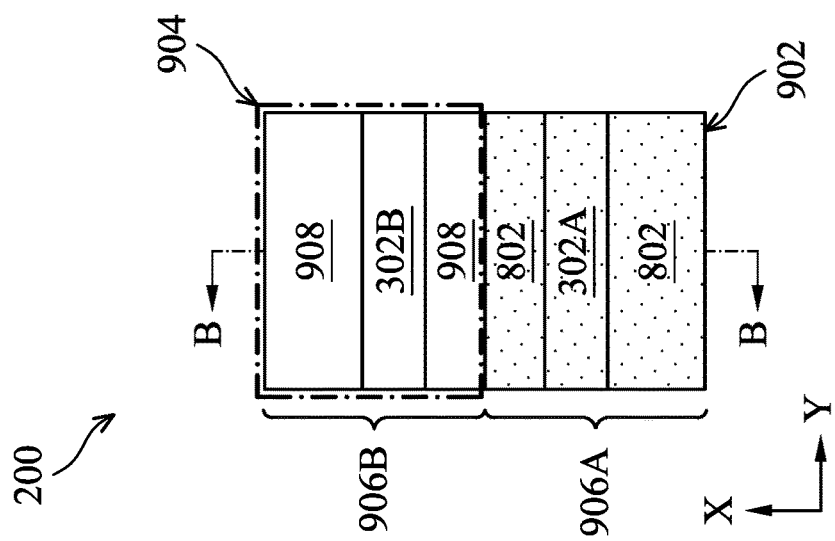
Figure 9C:
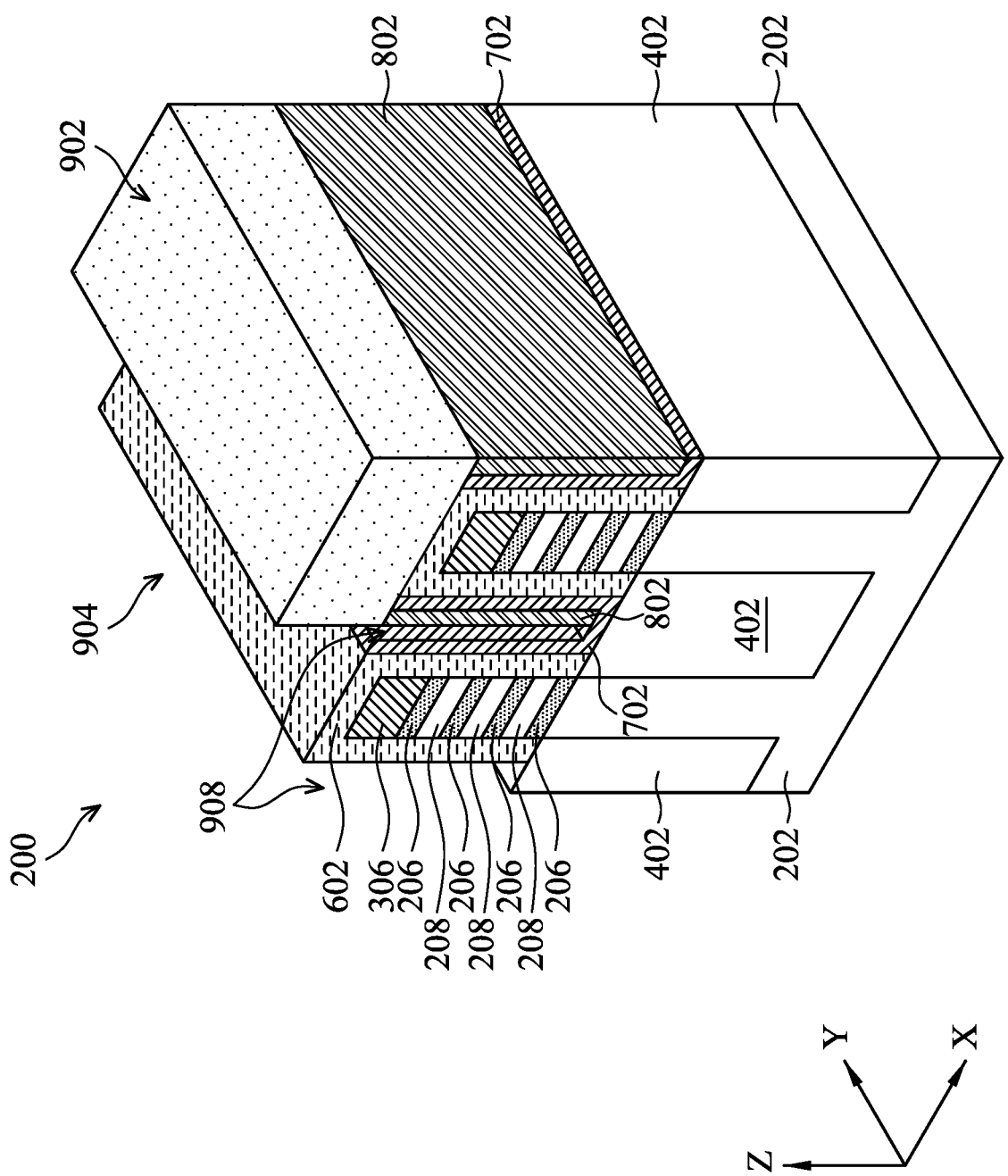

Referring to the example of FIGS. 9A, 9B, and 9C, a masking element 902 is formed over a first region 906A of the device 200 leaving an opening 904 over a second region 906B of the device 200. Region 906A includes fins 302 such as fin 302A that are the active region of a first transistor type (e.g., NMOS); region 906B includes fins 302 such as fins 302B that are the active region of a second transistor type (e.g., PMOS). Multiple regions 906A and 906B may be included on the substrate 202. In an embodiment, the masking element 902 is formed over the fin 302A that provides channel 208 for an NMOS device and the opening 904 is formed over the fin 302B that provides channel 208 for a PMOS device. However, one would recognize that the opposite device type may also be targeted.

The masking element 902 having openings 904 may be formed by suitable photolithography process(es). The lithography process can include forming a resist layer over the substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. In some implementations, the masking element 902 is a patterned resist layer. In other implementations, a patterned resist layer is used as an etch mask to pattern a hard mask layer that provides the masking element 902.

The masking element 902 is used as an etch mask during the selective removal of the first dielectric stressor-capable layer 802 from the region 906B of the substrate 202. In an embodiment, the first dielectric stressor-capable layer 802 is removed by a suitable selective etch that stops at the liner layer 702 (if provided). The selective etch may target the composition (e.g., oxide) of the first dielectric stressor-capable layer 802, while maintaining the sacrificial layer 602 and/or the liner layer 702. The removal of the first dielectric stressor-capable layer 802 from region 906B provides opening 908 adjacent the fins 302 of the second device type (e.g., PMOS), such as exemplified by the fin 302B.

In some implementations, the liner layer 702 may be removed from the device 906B region after and/or concurrently with the removal of the first dielectric stressor-capable layer 802. Thus, while the figures illustrate maintaining the liner layer 702, in other embodiments, this liner layer 702 is omitted from the second region 906B of the device. In some embodiments, as discussed above, the liner layer 702 is omitted entirely. After patterning the first dielectric stressor-capable layer 802 and/or the liner layer 702, the masking element 902 may be removed by suitable etching or stripping process.

The method 100 then proceeds to block 116 where a second dielectric stressor-capable layer is deposited on the substrate. The second dielectric stressor-capable layer is different in stress profile from the first dielectric stressor-capable layer. In an embodiment, the second dielectric stressor-capable material is selected to provide a stress desired for enhancement of performance a second device type, while the first dielectric stressor-capable material is selected to provide a stress desired for enhancement of performance of a first device type. In an embodiment, the second dielectric stressor-capable material is selected to provide a stress desired for a PFET device. In doing so, in some implementations, the second dielectric stressor-capable layer is different in composition from the first dielectric stressor-capable layer. In some implementations, the second dielectric stressor-capable layer includes a similar composition as the first dielectric stressor-capable layer, but its fabrication is tuned (e.g., by deposition process, atomic weight percentages, etc.) to provide a different stress profile.

In an embodiment, the second dielectric stressor-capable material is a material that can expand during subsequent thermal processes. The expanding of the second dielectric stressor-capable material can cause a compressive stress to the width direction (x-direction) and a tensile stress to the vertical direction (y-direction) in the adjacent material (e.g., the channel region or semiconductor layers 208).

In an embodiment, the second dielectric stressor-capable material is a nitride composition. Exemplary compositions include a nitride such as silicon nitride, silicon oxynitride, doped silicon oxide (e.g., carbon doped silicon oxide, phosphor doped silicon oxide). The stress of the second dielectric stressor-capable material may be tuned to provide a compressive stress in the channel width direction (e.g., x-direction) and/or the channel length direction (e.g., y-direction) and a tensile stress in the vertical direction (e.g., z-direction).

In some embodiments, the second dielectric stressor-capable material may be deposited by a CVD process, a subatmospheric CVD (SACVD) process, a flowable CVD process, an ALD process, a PVD process, HARP, and/or other process providing suitable gap-filling properties. The deposition may be tuned to provide the stress including the process temperature, precursor gas flow rate and ratio, process pressure, and/or other parameters.

Figures 10A, 10B:
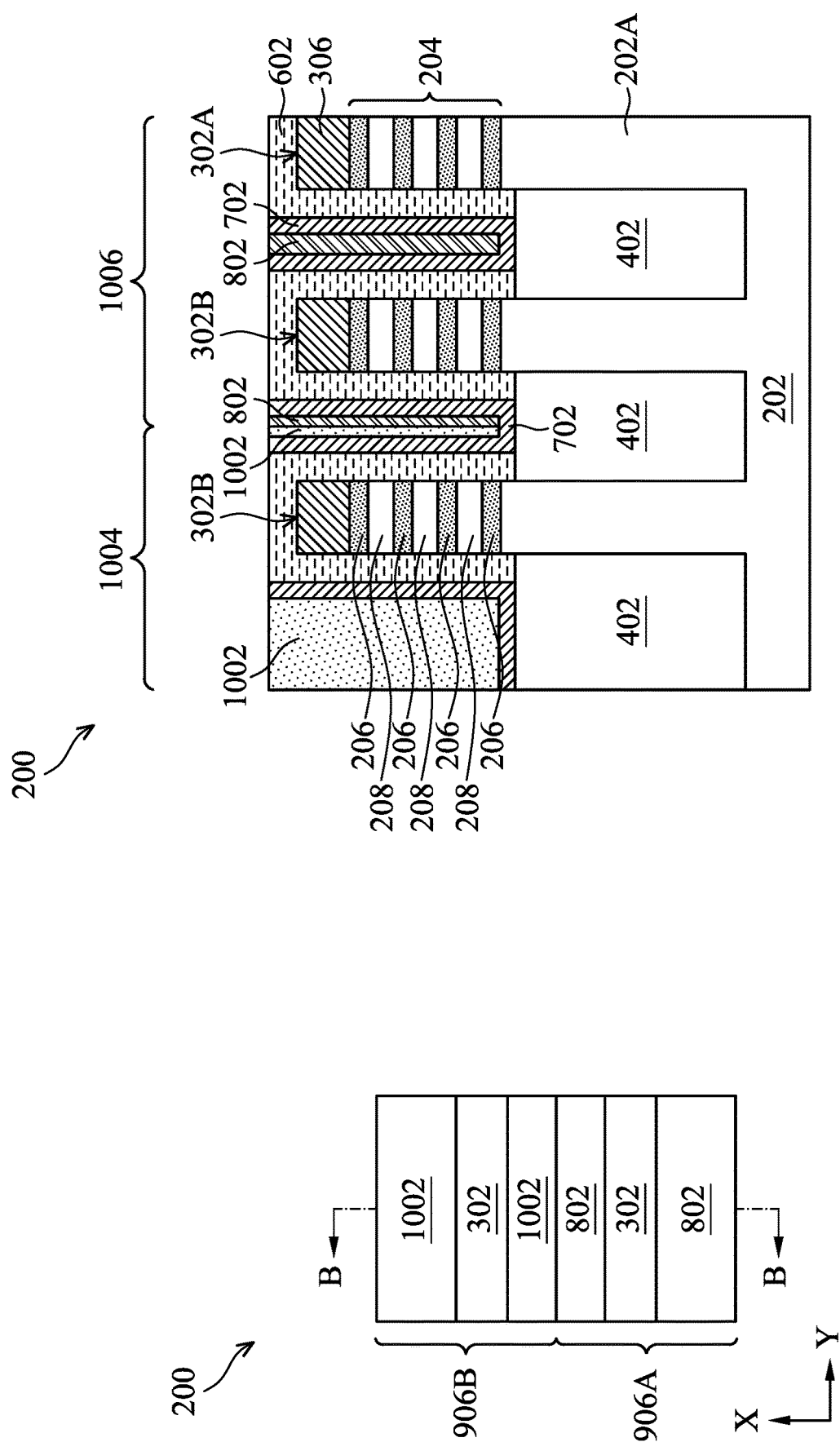
Figure 10C:
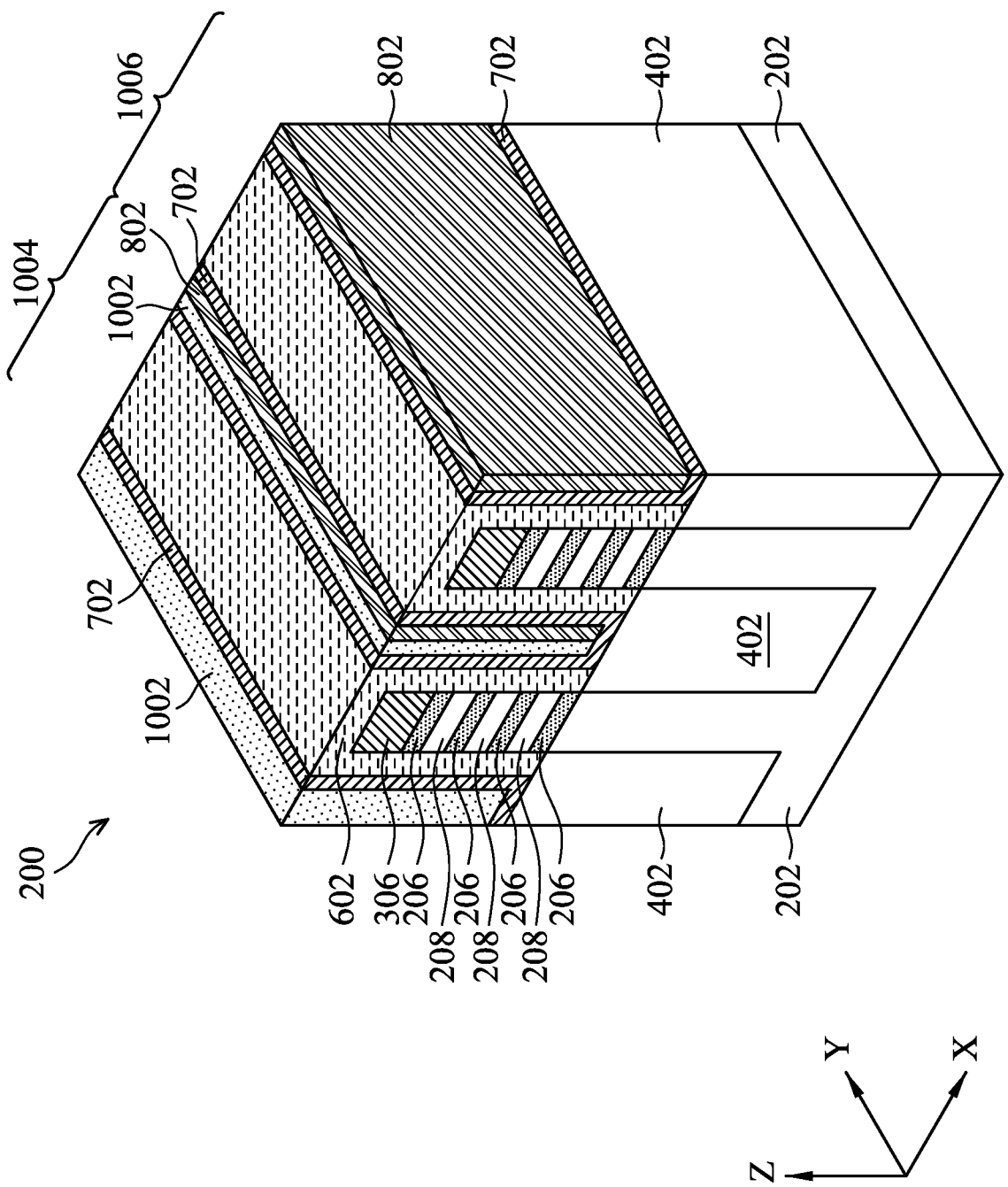
Figure 11A:
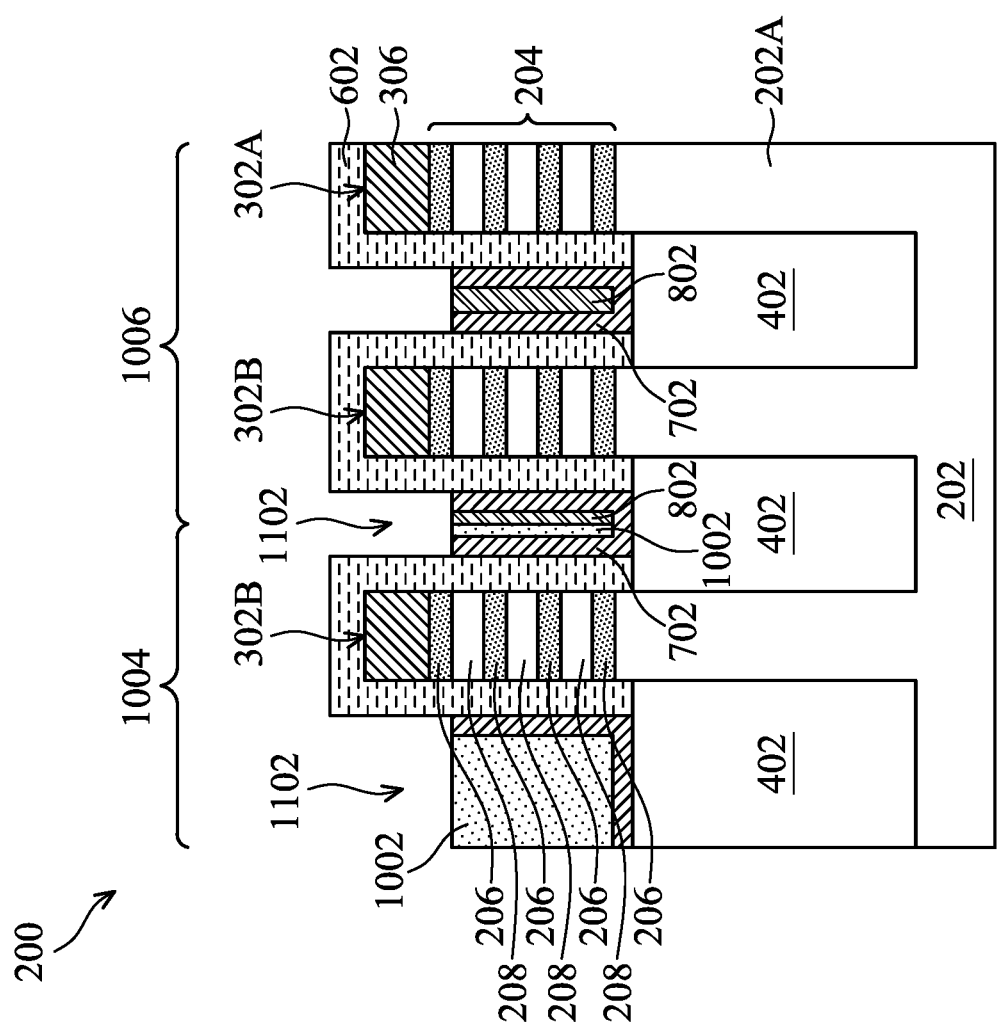
Figure 11B:
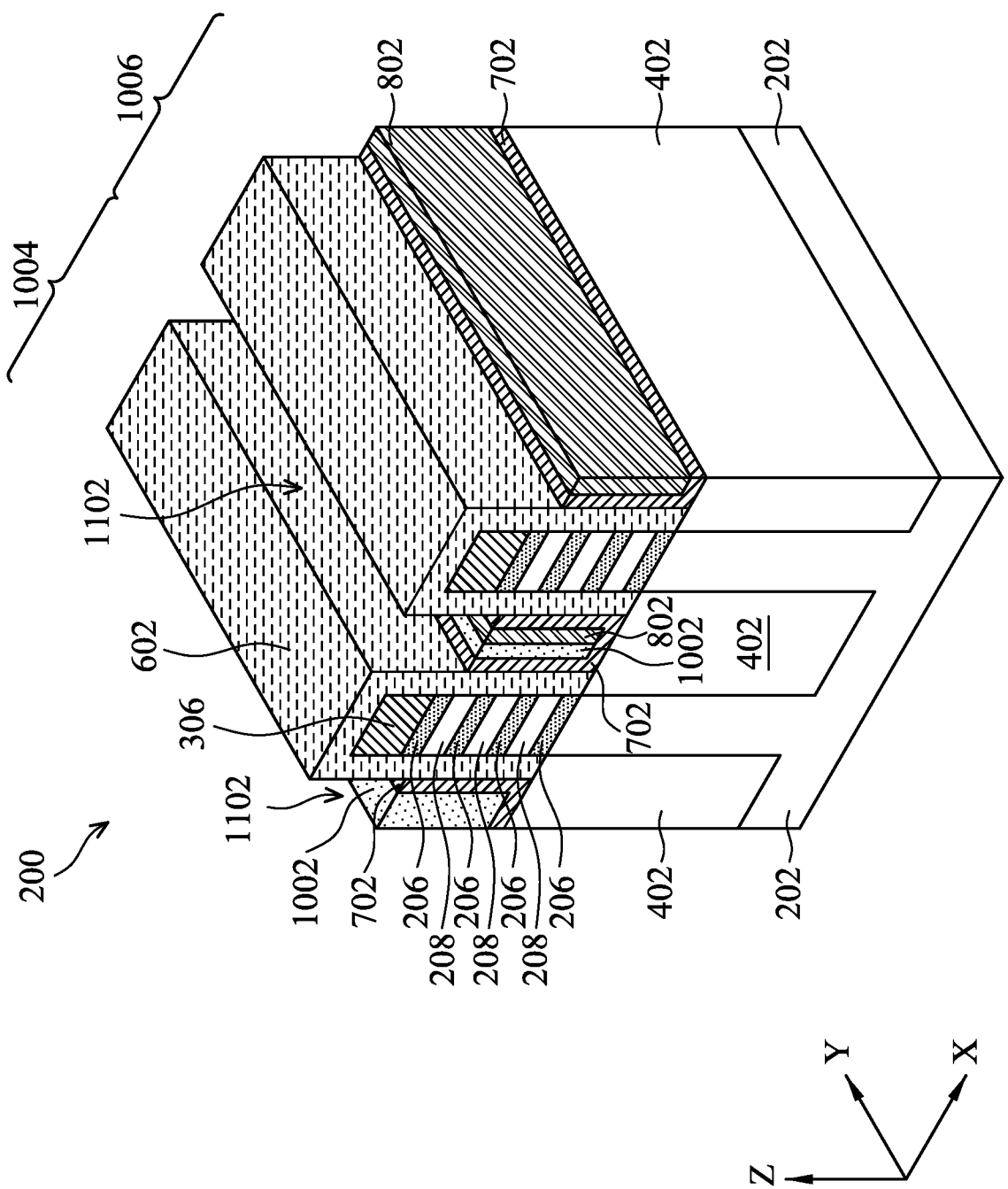

Referring to the example of FIGS. 10A, 10B, and 10C, a second stressor-capable material 1002 is deposited over the fins 302 and within the trenches 908. In an embodiment, the liner layer 702 is maintained in the region 906B and the second stressor-capable material 1002 is deposited directly on the liner layer 702. In other embodiments, the liner layer 702 is removed (or note formed) and the second stressor-capable material 1002 is deposited directly for example, on the sacrificial layer 602.

In an embodiment, the second stressor-capable material 1002 has a composition selected to provide appropriate stress profile for a PMOS device that will be formed using an active region of the fin 302B. In other words, the channel layers 208 of the fin 302B provide a channel of a PMOS device, the channel being stressed by the second stressor-capable material 1002. In an embodiment, the second stressor-capable material 1002 may provide a compressive stress in the x-direction and a tensile stress in the z-direction on the subsequently released channel regions (208) as discussed below with reference to FIGS. 14A and 14B.

Continuing with the formation of the second stressor-capable material 1002, as illustrated in FIGS. 10A, 10B, and 10C, a planarization process may be performed. In some implementations, the sacrificial layer 602 acts as an etch stop for the planarization process.

Thus, in some embodiments, the first stressor-capable material 802 is selected to shrink or densify during subsequent thermal processing and the second stressor-capable material 1002 is selected to expand during subsequent thermal processing. The densifying and/or expansion may occur concurrently during a thermal process. In a further embodiment, the first stressor-capable material 802 is directed to NMOS devices and the second stressor-capable material 1002 is directed to PMOS devices. In some embodiments, the first stressor-capable material 802 and the second stressor-capable material 1002 are both nitride films. Nitride films can be tuned to have very high intrinsic stress ranging from tension to compression. The film stress can be provided by changing the deposition conditions such as precursor (SiH4/N2/He) flow rates, pressure, HF power, and electrode gap in plasma processes. Thus, the first stressor-capable material 802 is tuned to a first stress profile (e.g., tensile on x-direction), and the second stressor-capable material 1002 is tuned to a second stress profile (e.g., compressive on x-direction). In other embodiments, the first stressor-capable material 802 is an oxide material providing a first stress profile (e.g., tensile on the x-direction) and the second stressor-capable material is a nitride material, each providing the suitable stress profile (e.g., compressive on the x-direction).

Thus, providing the first dielectric stressor-capable material in the first device type region and the second dielectric stressor-capable material in the second device type region allows for tuning of the stress profile provided by the respective material onto the device and the channel regions in particular. In CMOS devices, the introduction of stress, for example to improve device carrier mobility. For an NMOS device, it is useful to NMOS electron mobility to provide a tensile stress in the channel layer in the x-direction, and compression stress is useful to PMOS device (e.g., hole mobility) in the channel layer in the x-direction. Providing different materials adjacent these regions allows both desires to be met.

Figures 14A, 14B:
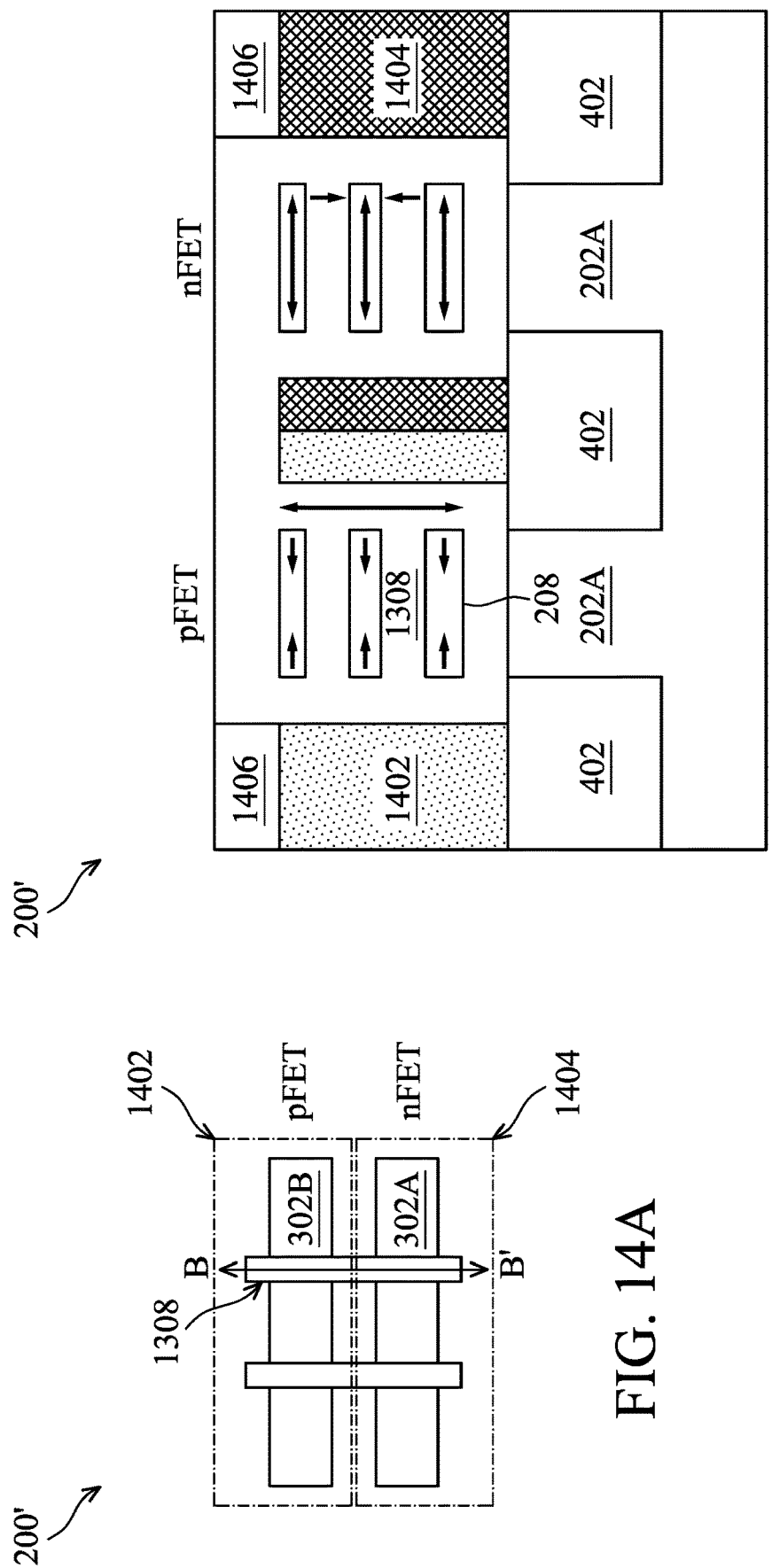
FIGS. 14A and 15A are fragmentary top views of multigate devices of, in portion or entirety, according to various aspects of the present disclosure.
FIGS. 14B and 15B are fragmentary cross-sectional views of multigate devices of, in portion or entirety, according to various aspects of the present disclosure.

FIGS. 14A and 14B are illustrative of an embodiment of a device 200' that may be substantially similar to that of the device 200 discussed above and provided by the method 100. FIGS. 14A and 14B illustrate proving of a stressor layer 1402 in the pFET region and stressor layer 1404 in the nFET region. The stressor layer 1402 has a composition tuned to provide a compressive stress in the x-direction onto the channel layer (channel width) and a tensile stress in the z-direction onto the channel layer. The stressor layer 1402 may be substantially similar to the second dielectric stressor-capable material 1002 discussed above. The stressor layer 1404 has a composition tuned to provide a tensile stress in the x-direction onto the channel layer (channel width) and a compressive stress in the z-direction onto the channel layer. The stressor layer 1404 may be substantially similar to the first dielectric stressor-capable material 802 discussed above. A dielectric layer 1406 is formed over the stressor layers 1402, 1404 that may provide for isolation between gate structures. In some implementations, the dielectric layer 1406 is substantially similar to the layer 1202 discussed below.

Figures 15A, 15B:
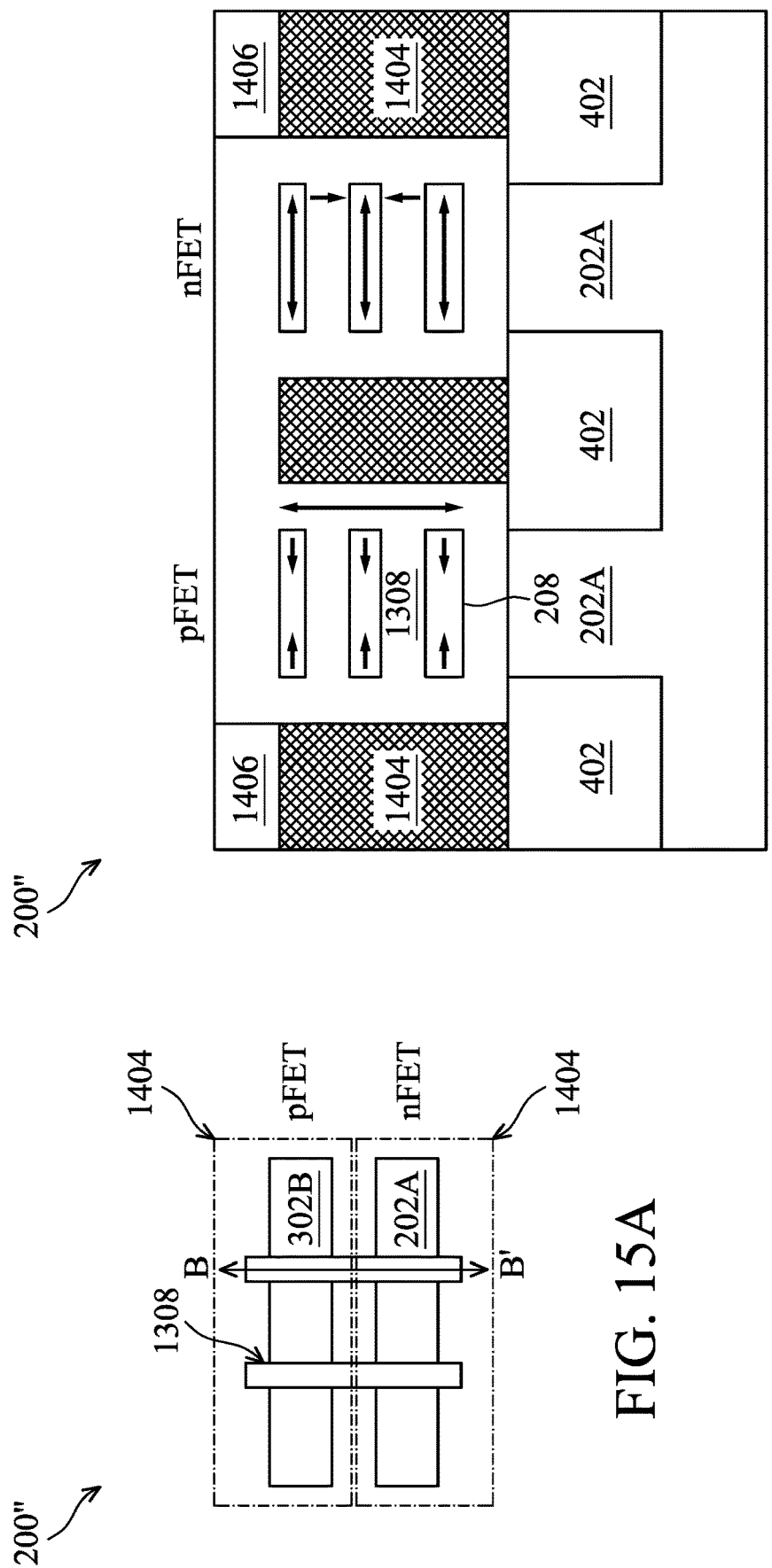

FIGS. 15A and 15B are illustrative of an embodiment of a device 200" that may be substantially similar to that of the device 200 discussed above and provided by the method 100. In some implementations, it may be desirable to provide tensile stress in channel width dimension (x-direction) for each of NMOS and PMOS device. In some implementations, the PMOS device may have a sensitivity to the vertical component of the stress such that benefits to a compressive stress on the channel are outweighed by the desire to provide a compressive stress in the z-direction. Such an example is illustrated in FIGS. 15A and 15B, the process of the method 100 is utilized in part to form a single stressor-inducing layer 1404 for both an NMOS GAA and a PMOS GAA device of the semiconductor device 200". The single stressor layer 1404 may be substantially similar to the first dielectric stressor-capable material 802 discussed above. The semiconductor device 200" may be formed on the same substrate as the semiconductor device 200', and for example later interconnected by a MLI. In other words, the patterning step of block 114 may maintain the first dielectric stressor material over a subset of devices of the second type (e.g., PFET).

Returning to the method 100, after formation of the first and second dielectric stressor-capable materials in the first and second device regions respectfully, the method 100 continues to block 118 where portions of the first and second dielectric stressor layer are recessed to provide a dielectric protection layer. In some implementations, the dielectric protection layer protects the stressor layers and/or provides for a gate-cut process, separating portions of the gate line. Referring to the example of FIGS. 11A and 11B, a recess 1102 is formed over the first and second stressor-capable layers 802 and 1002. The recess 1102 may be formed by a suitable etching process such as a dry etch.

Figure 12A:
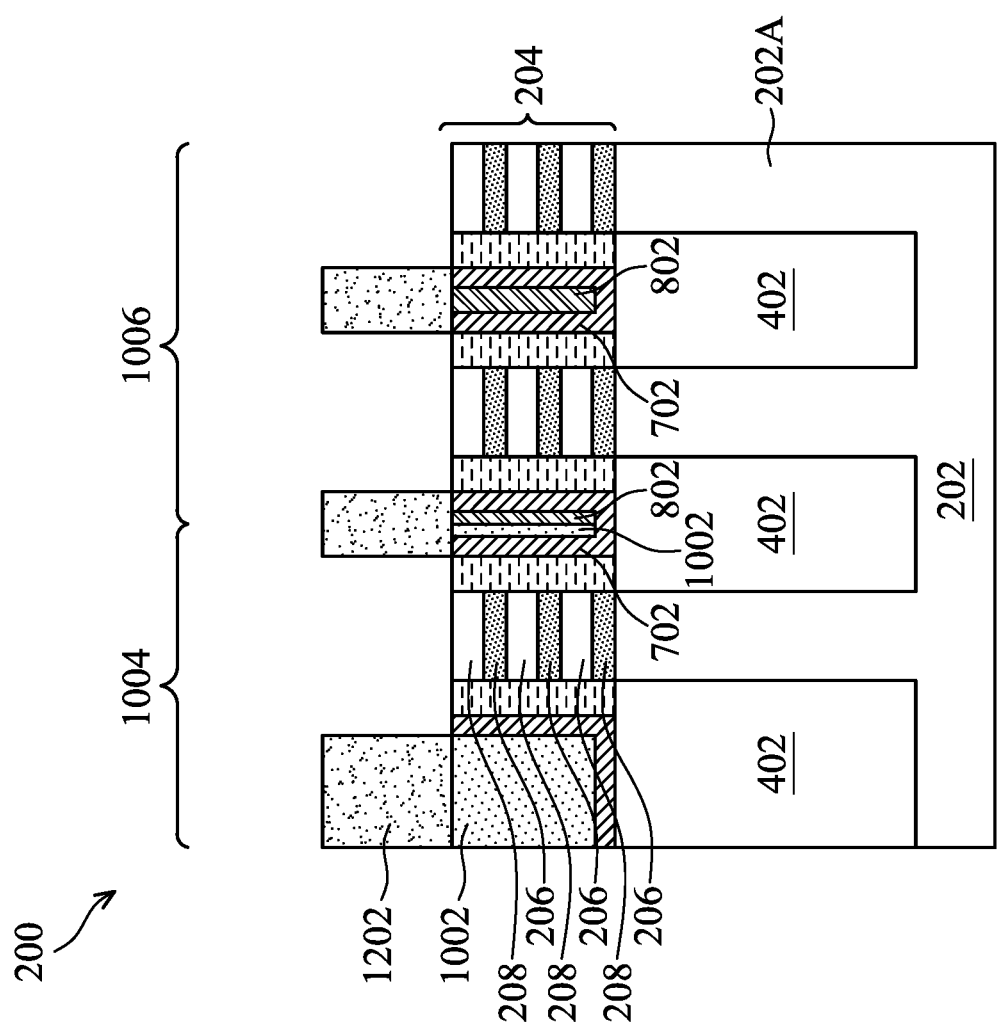
Figure 12B:
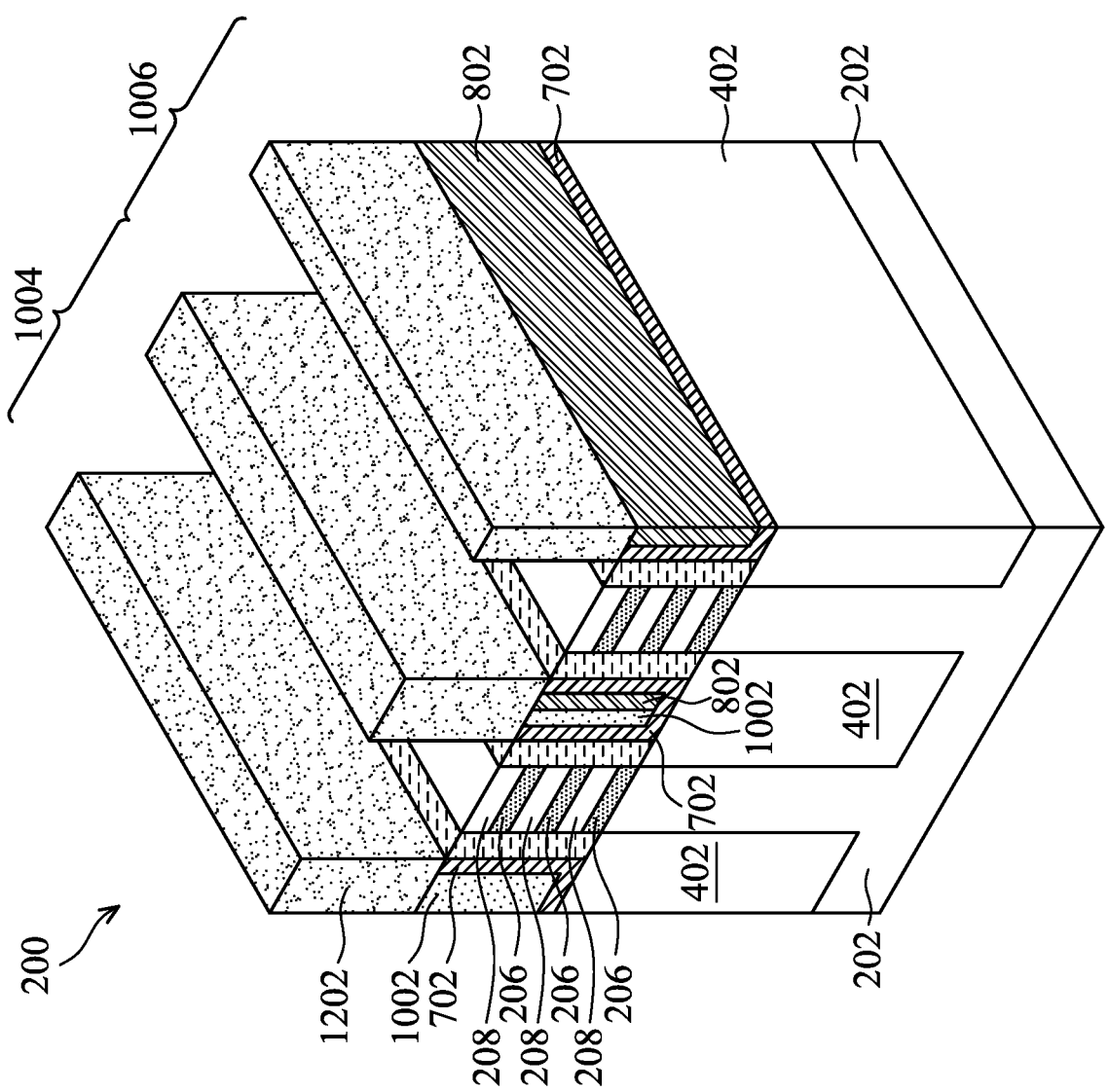

As illustrated in FIGS. 12A and 12B, the recesses 1102 may be filled with dielectric protection material 1202. In some embodiments, the dielectric protection layer 1202 may include a high-k dielectric material, such as a metal oxide. A high-k dielectric material refers to a dielectric material that has a dielectric constant greater than that of silicon dioxide (~3.9). Suitable high-k dielectrics may include hafnium oxide, zirconium oxide, titanium oxide, tantalum oxide, or aluminum oxide. In some embodiments, the dielectric protection layer 1202 may be deposited using CVD, flowable CVD, and/or other suitable deposition method(s), which may be followed by a planarization process, such as a CMP process providing a planar top surface.

After formation of the dielectric protection layer 1202, the hard mask 306 may be removed by a selective etching process to expose an upper layer of the stack 204 of the fins 302. The gate structure may then be formed over the fin 302. It is noted that in some implementations, the layer 1202 is provided to cut a gate line into separate structures. In some implementations, portions of the layer 1202 are removed to provide a contiguous gate line. See for example, FIGS. 14B and 15B.

The method 100 then proceeds to block 120 where transistor elements (e.g., gate structure, source/drain structure) are formed. In some embodiments, block 120 includes a plurality of steps including forming a dummy gate structure over the fins 302, recessing source/drain regions of the fins 302, growing an epitaxial source/drain feature in the recessed source/drain regions, removing the dummy gate structure to form a trench over the fins 302 in the channel region, and performing a channel release process within the channel region. After releasing the channel regions (and in some implementations forming inner spacers), a metal gate structure is formed surrounding the channel regions. Exemplary embodiments of these processes are briefly discussed below.

Figures 13A, 13B:
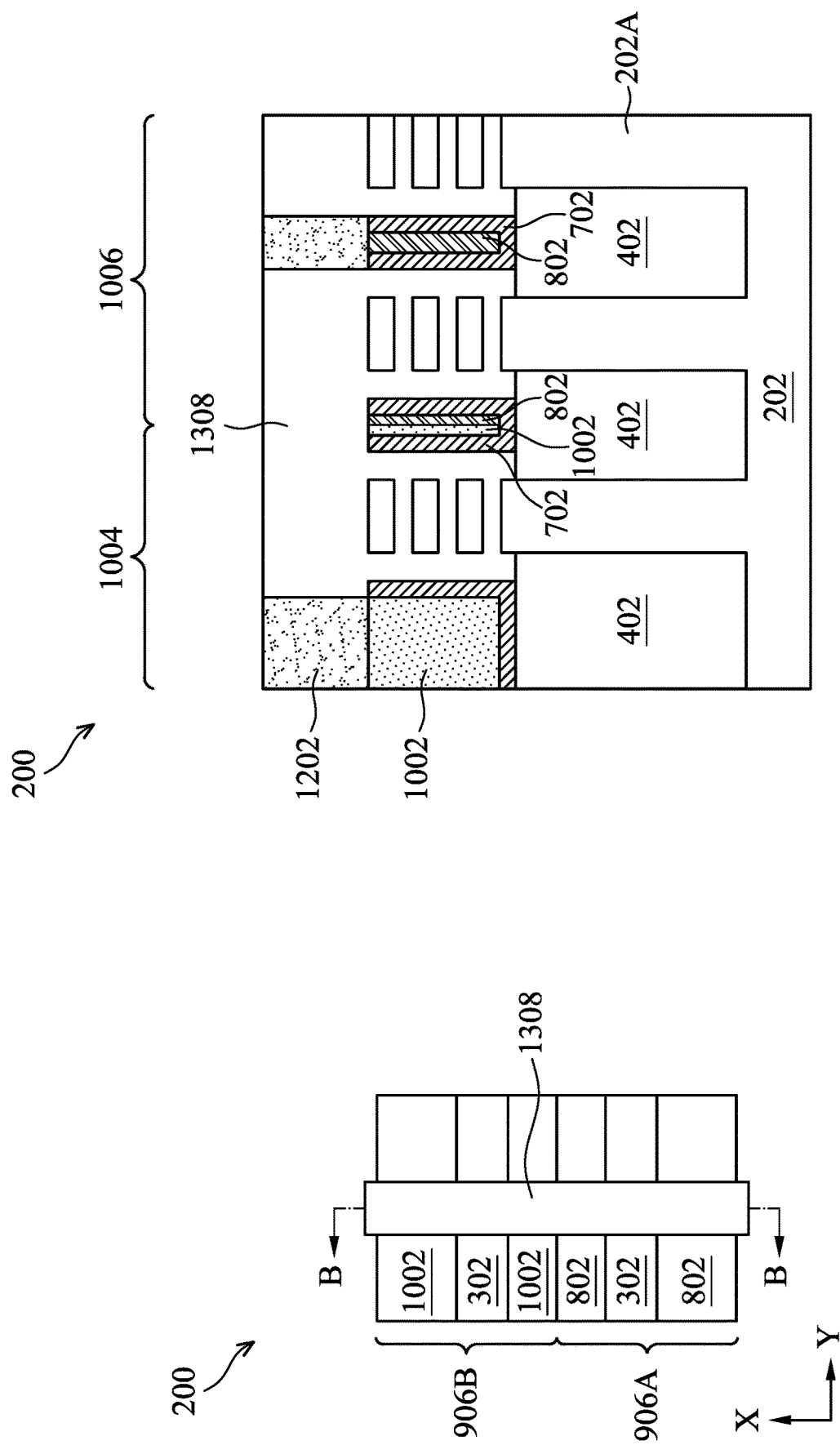
Figure 13C:
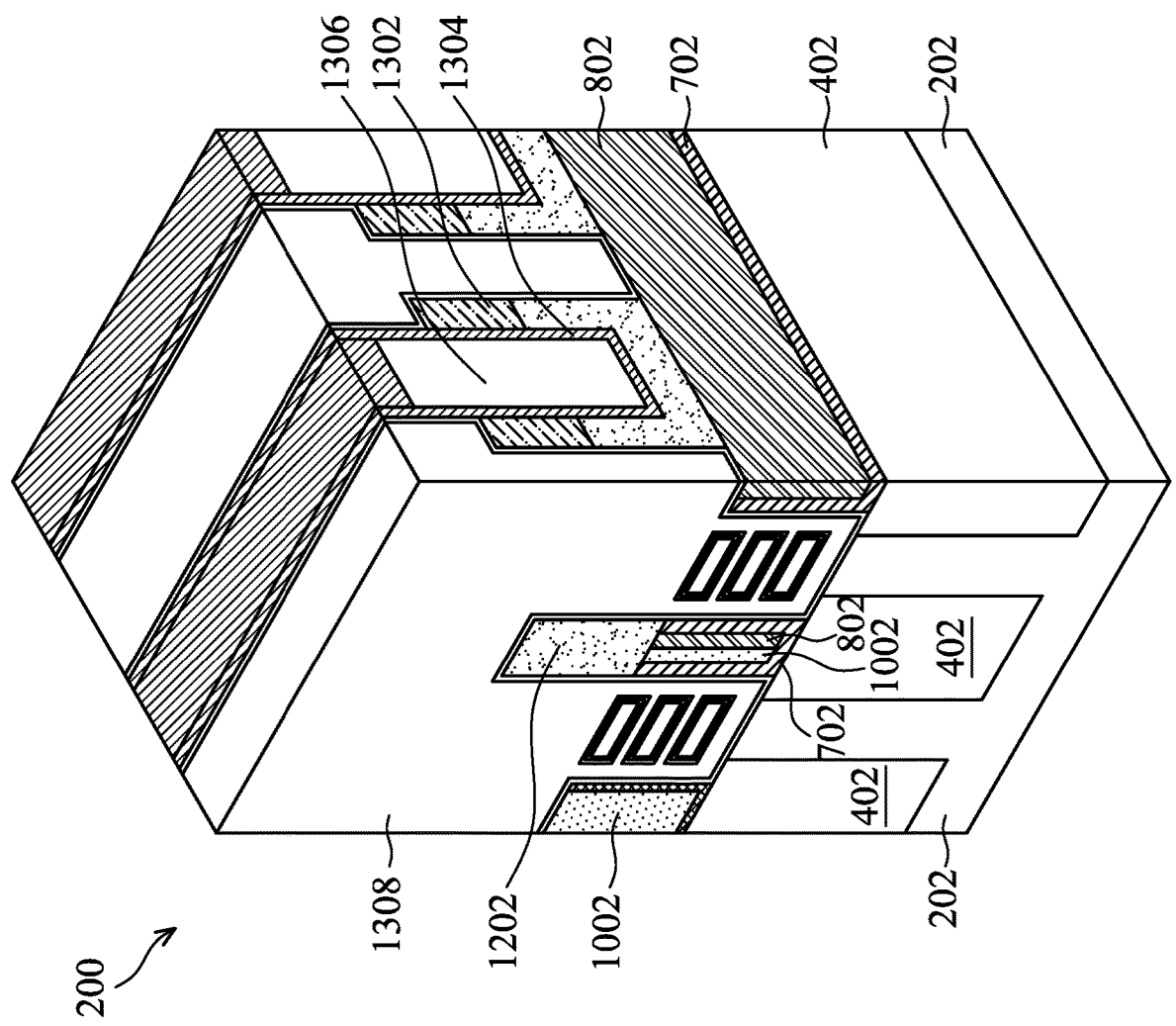

In some implementations, dummy gate structures, which are configured substantially as illustrated in the top view of FIG. 13A, are disposed over channel regions of the fins 302 of the multigate device 200 and between source/drain regions (S/D) of the fins 302 of the multigate device 200. Each dummy gate structures may extend over one or a plurality of fins 302 including extending over fin structures of a different device type (e.g., NFET, PFET).

Each dummy gate structure includes a dummy gate dielectric and a dummy gate electrode. Dummy gate dielectric includes a dielectric material, such as silicon oxide, a high-k dielectric material, other suitable dielectric material, or combinations thereof. In some embodiments, dummy gate dielectric includes an interfacial layer (including, for example, silicon oxide) and a high-k dielectric layer disposed over the interfacial layer. Dummy gate electrode includes a suitable dummy gate material, such as polysilicon. In some embodiments, dummy gate structures include numerous other layers, for example, hard mask layers, capping layers, interface layers, diffusion layers, barrier layers, or combinations thereof. In one implementation, the hard mask layer includes a silicon oxide layer and a silicon nitride layer. Dummy gate structures are formed by deposition processes, lithography processes, etching processes, other suitable processes, or combinations thereof. A lithography patterning and etching process is then performed to pattern the hard mask layer, the dummy gate electrode layer, and the dummy gate dielectric layer to form dummy gate structures. The dummy gate structures may further include gate spacers disposed on the sidewalls (see spacers 1302).

Block 120 may continue to form the source/drain features adjacent the dummy gate structures. In some implementations, in source/drain regions of multigate device 200 (i.e., source/drain regions of fins 302 that are not covered by gate structures) are at least partially removed or recessed. Thereafter, epitaxial source/drain features may be formed over the recessed fin regions. An epitaxy process can use CVD deposition techniques (for example, LPCVD, VPE, and/or UHV-CVD), molecular beam epitaxy, other suitable epitaxial growth processes, or combinations thereof. The epitaxy process can use gaseous and/or liquid precursors, which interact with the composition of fin portions 202A and/or semiconductor layers 208. Epitaxial source/drain features are doped with n-type dopants and/or p-type dopants depending on the device type to be formed. In some embodiments, for NMOS transistors such as formed on fin 302A, epitaxial source/drain features include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for PMOS transistors, such as formed on fin 302B, epitaxial source/drain features include silicon germanium or germanium, which can be doped with boron, other p-type dopant, or combinations thereof (for example, forming Si:Ge:B epitaxial source/drain features).

In some implementations, following the formation of the source/drain epitaxial features, insulating layers are formed thereover. Deposition processes (such as CVD, PVD, ALD, HDPCVD, MOCVD, RPCVD, PECVD, LPCVD, ALCVD, APCVD, other suitable methods, or combinations thereof) are performed to form a bottom contact etch stop layer (B-CESL) 1304 and an inter-level dielectric (ILD) layer 1306 over multigate device 200. A CMP process and/or other planarization process is performed until reaching (exposing) top portions (or top surfaces) of dummy gate stacks. In some embodiments, ILD layer 1306 is formed by FCVD, HARP, HDP, or combinations thereof and may include a dielectric material such as, for example, silicon oxide, carbon doped silicon oxide, silicon nitride, silicon oxynitride, TEOS-formed oxide, PSG, BSG, BPSG, FSG, Black Diamond® (Applied Materials of Santa Clara, California), xerogel, aerogel, amorphous fluorinated carbon, parylene, BCB-based dielectric material, SiLK (Dow Chemical, Midland, Michigan), polyimide, other suitable dielectric material, or combinations thereof. CESL 1304 can include silicon and nitrogen, such as silicon nitride or silicon oxynitride.

In some implementations, block 120 continues to include a replacement gate process to replace the dummy gate structure discussed above with a metal gate structure(s). After a selective etch to remove the dummy gate electrode and/or dummy gate dielectric, a channel release process may be performed to result in the removal of the semiconductor layers 206 in the channel region, thereby forming suspended semiconductor layers 208 in the channel region, which are separated from one another and/or fin portions 202A by gaps. The etching process releasing the channel layers 208 may be a selective dry etching process, a wet etching process, or a combination thereof. The channel release process may further include removing the sacrificial layer 602 in the channel region for example forming gap between an end of the channel layer 208 where a metal gate structure can be formed thus, providing control of the channel on additional sides. The channel release process may include an etching process selective to a composition (e.g., silicon germanium) of the sacrificial layer 602 and/or the semiconductor layers 206, while providing no to minimal etching of the channel layers 208. In some embodiments, channel layers 208 have cylindrical-shaped profiles (e.g., nanowires), rectangular-shaped profiles (e.g., nanobars), sheet-shaped profiles (e.g., nanosheets (i.e., dimensions in the X-Y plane are greater than dimensions in the X-Z plane and the Y-Z plane to form sheet-like structures), or any other suitable shaped profile.

Block 120 of the method 100 then proceeds to fill the formed openings by the removal of the dummy gate structure and the release of the channel layers with metal gate structures illustrated as gate structure 1308. The metal gate structures 1308 may be the functional gate(s) of the GAA device of the device 200. Metal gate structures 1308 are configured to achieve desired functionality according to design requirements of multigate device 200. In other words, the metal gate structures 1308 may differ in metallization over the fin 302A in comparison to fin 302B to provide the appropriate work function. In some embodiments, the metal gate structure 1308 over one fin 302 is contiguous with the metal gate structure 1308 over a second fin, such as illustrated by the portion(s) above the first and second stressor-capable layers 802 and 1002. Metal gate structures 1308 each include a gate dielectric (for example, a high-k gate dielectric layer) and a gate electrode (for example, a work function layer and a bulk conductive layer). Metal gate structures 1308 may include numerous other layers, such as capping layers, interface layers, diffusion layers, barrier layers, hard mask layers, or combinations thereof. In some embodiments, forming metal gate structures 1308 includes depositing a gate dielectric layer over multigate device 200, where the gate dielectric layer partially fills gate openings between channel layers 208, depositing a gate electrode layer(s) over the gate electrode layer, where the gate electrode layer fills a remainder of the openings, and performing a planarization process to remove excess gate materials from multigate 200. Gate dielectrics include a high-k dielectric layer, which includes a high-k dielectric material, which for purposes of metal gate structure 1308 refers to a dielectric material having a dielectric constant that is greater than that of silicon dioxide (k≈3.9). For example, the high-k dielectric layer includes HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. In some embodiments, the gate dielectric includes an interfacial layer disposed between the high-k dielectric layer and channel layers 208. Gate electrode layer(s) are formed over gate dielectrics. Gate electrodes includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, gate electrodes include a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, ZrSi2, MoSi2, TaSi2, NiSi2, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. Gate electrodes 1308 are formed by any of the processes described herein, such as ALD, CVD, PVD, plating, other suitable process, or combinations thereof.

The method 100 may then proceeds to block 122 where further processes are formed. For example, in some embodiments, a multi-layer interconnect (MLI) feature is formed. An MLI feature electrically couples various devices (for example, p-type transistors and/or n-type transistors of multigate device 200, resistors, capacitors, and/or inductors) and/or components (for example, gate electrodes and/or epitaxial source/drain features of PFETs and/or NFETs of multigate device 200), such that the various devices and/or components can operate as specified by design requirements of multigate device 200. An MLI feature includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature. During operation, the interconnect features are configured to route signals between the devices and/or the components of multigate device 200 and/or distribute signals (for example, clock signals, voltage signals, and/or ground signals) to the devices and/or the components of multigate device 200.

It is noted that the method 100 includes some embodiments where a first dielectric stress-capable material is formed that targets an NMOS region of the substrate, and which is subsequently removed from a PMOS region and replaced by a second dielectric stress-capable material that targets the PMOS region. However, in other embodiments, these device types are reversed and the first dielectric stress-capable material is formed in a PMOS region and removed from an NMOS region, and a second dielectric stress-capable material targeting the NMOS region is formed therein.

Thus, provided is methods and devices that allow in some implementations for higher performance of CMOS devices by allowing for stress tuning to NMOS and PMOS devices. It is understood, however, that other embodiments may offer additional advantages, and not all advantages are necessarily disclosed herein, and that no particular advantage is required for all embodiments. The present disclosure provides for many different embodiments.

An exemplary method discussed herein includes a method of semiconductor device fabrication including forming a first fin structure comprising a plurality of semiconductor layers and a second fin structure comprising the plurality of semiconductor layers. A shallow trench isolation (STI) feature is formed interposing a lower portion of the first fin structure and a lower portion of the second fin structure. A first dielectric layer is formed over the STI feature and adjacent the first fin structure. A second dielectric layer is formed over the STI feature and adjacent the second fin structure. The first dielectric layer applies a first stress profile to the first fin structure and the second dielectric layer applies a second stress profile to the second fin structure. The method further includes removing certain of the plurality of semiconductor layers to form a first plurality of channel regions from the first fin structure and from a second plurality of channel regions from the second fin structure.

In an embodiment, the method further includes forming a gate structure around the first plurality of channel regions to form an n-type transistor. In some implementations, forming another gate structure around the second plurality of channel regions to form a p-type transistor. In an embodiment, the gate structure and another gate structure are contiguous and extend over the first dielectric layer and the second dielectric layer.

In some implementations, the method includes forming the first dielectric layer includes depositing an oxide. In an embodiment, forming the second dielectric layer includes depositing a nitride. In a further embodiment, the method includes forming a liner layer over the first and second fin structures prior to forming the first dielectric layer. In an embodiment, the first stress profile applied to the first fin structure includes creating a tensile stress in the first plurality of channel regions; the second stress profile applied to the second fin structure includes creating a compressive stress in the second plurality of channel regions.

In another of the broader scope embodiments, a method of semiconductor device fabricating provides for receiving a substrate having a first fin and a second fin. An isolation feature is formed between a bottom region of the first fin and a bottom region of the second fin. A first stressor layer is deposited over the isolation feature, the first fin and the second fin. The method further includes patterning the deposited first stressor layer to remove the first stressor layer from adjacent the first fin to form an opening adjacent the first fin. A second stressor layer is deposited in the opening. The deposited second stressor layer interfaces the first stressor layer over the isolation feature.

In an embodiment of the method, the method includes densifying the first stressor layer and expanding the second stressor layer. In an embodiment, the method includes densifying and the expanding being performed during a thermal process. In an embodiment, densifying the first stressor layer creates a tensile stress a portion of the second fin. Expanding the second stressor layer creates a compression stress in a portion of the first fin.

In an embodiment, the method further includes removing portions of each of the first fin and the second fin to form a plurality of channel regions and forming a gate structure around the plurality of channel regions. In an embodiment, the method further includes forming a liner layer after forming the isolation feature and prior to depositing the first stressor layer; and during the patterning the deposited first stressor layer, using the liner layer as an etch stop layer when etching the first stressor layer to form the opening. In an implementation, the first stressor layer includes an oxide and the second stressor layer includes a nitride.

In another of the broader embodiments, a semiconductor device is provided that includes a first gate all around (GAA) device and a second GAA device. The first GAA device includes a first gate structure around a first plurality of channel regions and the second GAA device includes a second gate structure around a second plurality of channel regions. A shallow trench isolation (STI) feature extends from a bottom of the first GAA to a bottom region of the second GAA device. A first dielectric layer and a second dielectric layer are each over the STI feature and between the first gate structure and the second gate structure. The first dielectric layer forms a tensile stress in a first direction within the first plurality of channel regions. The second dielectric layer forms a compressive stress in the first direction within the second plurality of channel regions.

In an embodiment, the device also includes a liner layer interposing each of the first dielectric layer and the first gate structure, the second dielectric layer and the second gate structure, the first dielectric layer and the STI feature, and the second dielectric layer and the STI feature. In an implementation, the first dielectric layer is an oxide and the second dielectric layer is a nitride. In an implementation, the first dielectric layer and the second dielectric layer include a nitride composition. In some embodiments, the first dielectric layer directly interfaces the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, the method comprising:
   forming a first fin structure comprising a plurality of semiconductor layers and a second fin structure comprising the plurality of semiconductor layers;
   forming a shallow trench isolation (STI) feature interposing a lower portion of the first fin structure and a lower portion of the second fin structure;

providing an opening extending between the first fin structure and the second fin structure, the opening disposed over the STI feature;

forming a first dielectric layer over the STI feature and in a first region of the opening adjacent the first fin structure;

forming a second dielectric layer over the STI feature and in a second region of the opening adjacent the second fin structure, wherein a sidewall of the second dielectric layer extends along a sidewall of the first dielectric layer, wherein the first dielectric layer applies a first stress profile to the first fin structure and the second dielectric layer applies a second stress profile to the second fin structure; and removing a first set of the plurality of semiconductor layers to form a first plurality of channel regions from the first fin structure and to form a second plurality of channel regions from the second fin structure wherein an upper surface of the first dielectric layer and an uppermost channel region of the first plurality of channel regions are substantially coplanar.

2. The method of claim 1, further comprising: forming a gate structure around the first plurality of channel regions to form an n-type transistor.

3. The method of claim 2, further comprising: forming another gate structure around the second plurality of channel regions to form a p-type transistor.

4. The method of claim 3, wherein the gate structure and the another gate structure are contiguous and extend over the first dielectric layer and the second dielectric layer.

5. The method of claim 1, wherein the forming the first dielectric layer includes depositing an oxide.

6. The method of claim 5, wherein the forming the second dielectric layer includes depositing a nitride.

7. The method of claim 6, further comprising: forming a liner layer over the first and second fin structures prior to forming the first dielectric layer, wherein the opening extends between sidewalls of the liner layer, and wherein the first dielectric layer and the second dielectric layer fill the opening.

8. The method of claim 1, wherein the first stress profile applied to the first fin structure includes creating a tensile stress in the first plurality of channel regions including an uppermost channel region of the first plurality of channel regions, and wherein the second stress profile applied to the second fin structure includes creating a compressive stress in the second plurality of channel regions including an uppermost channel region of the second plurality of channel regions, wherein the upper surface of the first dielectric layer, an upper surface of the second dielectric layer and the uppermost channel regions are substantially coplanar.

9. The method of claim 1, wherein the forming the first dielectric layer includes depositing the first dielectric layer in the opening and etching the first dielectric layer from the second region of the opening before forming the second dielectric layer.

10. A method of semiconductor device fabrication, the method comprising:

receiving a substrate having a first fin and a second fin;

forming an isolation feature between a bottom region of the first fin and a bottom region of the second fin;

over the isolation feature, the first fin and the second fin, depositing a first stressor layer;

patterning the deposited first stressor layer to remove the first stressor layer from adjacent the first fin to form an opening adjacent the first fin;

depositing a second stressor layer in the opening, wherein the deposited second stressor layer interfaces the first stressor layer over the isolation feature; and densifying the first stressor layer and expanding the second stressor layer.

11. The method of claim 10, wherein the densifying and the expanding are performed during a thermal process.

12. The method of claim 10, wherein the densifying the first stressor layer creates a tensile stress in a portion of the second fin; and wherein the expanding the second stressor layer creates a compression stress in a portion of the first fin.

13. The method of claim 10, further comprising: removing portions of each of the first fin and the second fin to form a plurality of channel regions; and forming a gate structure around the plurality of channel regions.

14. The method of claim 10, further comprising:

forming a liner layer after forming the isolation feature and prior to depositing the first stressor layer; and during the patterning the deposited first stressor layer, using the liner layer as an etch stop layer when etching the first stressor layer to form the opening.

15. The method of claim 10, wherein the first stressor layer includes an oxide and the second stressor layer includes a nitride.

16. A method of semiconductor device fabrication, the method comprising:

providing a substrate having a first fin and a second fin and an isolation feature extending between the first fin and the second fin;

selecting a first stressor layer composition to provide a tensile stress in a first direction within the second fin;

depositing the first stressor layer composition over the substrate;

patterning the deposited first stressor layer composition to remove the first stressor layer composition from adjacent the first fin to form an opening adjacent the first fin, the opening exposing a sidewall of the first stressor layer composition;

selecting a second stressor layer composition to provide a compressive stress in the first direction within the first fin; and depositing the second stressor layer composition in the opening, wherein the deposited second stressor layer has a vertically oriented interface with the first stressor layer composition over the isolation feature, wherein the vertically oriented interface is provided by the exposed sidewall of the first stressor layer composition.

17. The method of claim 16, wherein the first stressor layer composition is an oxide and the second stressor layer composition is a nitride.

18. The method of claim 16, wherein the first stressor layer composition and the second stressor layer composition are nitrides.

19. The method of claim 16, further comprising: densifying the first stressor layer composition.

20. The method of claim 16, further comprising: expanding the second stressor layer composition.

* * * * *